US 8,788,246 B2

(12) United States Patent
Tsunoda et al.

(10) Patent No.: US 8,788,246 B2
(45) Date of Patent: Jul. 22, 2014

(54) SIMULATION METHOD UTILIZING CARTESIAN GRID

(75) Inventors: Masaya Tsunoda, Kobe (JP); Arjun Yadav, Kobe (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 57 days.

(21) Appl. No.: 13/210,069

(22) Filed: Aug. 15, 2011

(65) Prior Publication Data

US 2012/0089380 A1 Apr. 12, 2012

(30) Foreign Application Priority Data

Oct. 12, 2010 (JP) ................................. 2010-229824

(51) Int. Cl.
*G06F 7/60* (2006.01)

(52) U.S. Cl.
USPC ....................................... 703/2; 703/6; 703/9

(58) Field of Classification Search
USPC .................................................... 703/2, 5, 10
See application file for complete search history.

(56) References Cited

U.S. PATENT DOCUMENTS

| 8,100,196 B2 * | 1/2012 | Pastusek et al. | 175/40 |
| 2011/0242095 A1 * | 10/2011 | Tsunoda | 345/419 |
| 2011/0313742 A1 * | 12/2011 | Tamada et al. | 703/6 |
| 2012/0296616 A1 * | 11/2012 | Tsunoda et al. | 703/9 |

OTHER PUBLICATIONS

Swarztrauber et al., "The Fourier and Cyclic Reduction Methods for Solving Poisson's Equation", John Wiley & Sons, 1996, pp. 1-17.*
Bini et al., "The cyclic reduction algorithm: from Poisson equation to stochastic processes and beyond", Springer Science + Business Media, Nov. 2008,pp. 23-60.*
Gallopoulos et al., "A parallel block cyclic reduction algorithm for the fast solution of elliptic equations", Elsevier Science Publishers B.V., 1989, pp. 143-157.*
Gander et al. "Cyclic Reduction—History and Applications", Workshop on Scientific Computing, 1997, pp. 1-15.*
Zhang et al.,"On cyclic Reduction and Finite Difference Schemes", University of Kentucky, 1999, pp. 1-11.*

* cited by examiner

*Primary Examiner* — Omar Fernandez Rivas
*Assistant Examiner* — Iftekhar Khan
(74) *Attorney, Agent, or Firm* — Birch, Stewart, Kolasch & Birch, LLP

(57) ABSTRACT

A simulation method utilizing a Cartesian grid comprises: a process in which a model of a two or three-dimensional space is defined as a Cartesian grid composed of cells; a process in which, based on a physical value and condition associated with the Cartesian grid, a Poisson equation is defined; and a process in which, the physical value is calculated by approximately solving the Poisson equation. The calculating process comprises: a step of calculating an error by using a Block-Cyclic Reduction Algorithm; a step of testing whether the calculated error is within a predetermined acceptable range or not; and a step of correcting a variable $\phi$ by the use of a correction parameter if the calculated error is outside the predetermined acceptable range. The calculating process repeats the error calculating step, testing step and error correcting step until the error becomes within the predetermined acceptable range.

4 Claims, 25 Drawing Sheets
(2 of 25 Drawing Sheet(s) Filed in Color)

|    | 1 | 2 | 3 | 4 | 5 | 6 | 7 | 8 | 9 | 10 | 11 | 12 | 13 | 14 | 15 |
|----|---|---|---|---|---|---|---|---|---|----|----|----|----|----|----|
| 1  | # | # | 0 | # | 0 | 0 | 0 | 0 | 0 | 0  | 0  | 0  | 0  | 0  | 0  |
| 2  | # | # | # | 0 | # | 0 | 0 | 0 | 0 | 0  | 0  | 0  | 0  | 0  | 0  |
| 3  | 0 | # | # | 0 | 0 | # | 0 | 0 | 0 | 0  | 0  | 0  | 0  | 0  | 0  |
| 4  | # | 0 | 0 | # | # | 0 | # | 0 | 0 | 0  | 0  | 0  | 0  | 0  | 0  |
| 5  | 0 | # | 0 | # | # | # | 0 | # | 0 | 0  | 0  | 0  | 0  | 0  | 0  |
| 6  | 0 | 0 | # | 0 | # | # | 0 | 0 | # | 0  | 0  | 0  | 0  | 0  | 0  |
| 7  | 0 | 0 | 0 | # | 0 | 0 | # | # | 0 | #  | 0  | 0  | 0  | 0  | 0  |
| 8  | 0 | 0 | 0 | 0 | # | 0 | # | # | # | 0  | #  | 0  | 0  | 0  | 0  |
| 9  | 0 | 0 | 0 | 0 | 0 | # | 0 | # | # | 0  | 0  | #  | 0  | 0  | 0  |
| 10 | 0 | 0 | 0 | 0 | 0 | 0 | # | 0 | 0 | #  | #  | 0  | #  | 0  | 0  |
| 11 | 0 | 0 | 0 | 0 | 0 | 0 | # | # | 0 | #  | #  | #  | 0  | #  | 0  |
| 12 | 0 | 0 | 0 | 0 | 0 | 0 | 0 | # | 0 | #  | #  | 0  | 0  | 0  | #  |
| 13 | 0 | 0 | 0 | 0 | 0 | 0 | 0 | 0 | 0 | #  | 0  | 0  | #  | #  | 0  |
| 14 | 0 | 0 | 0 | 0 | 0 | 0 | 0 | 0 | 0 | 0  | #  | 0  | #  | #  | #  |
| 15 | 0 | 0 | 0 | 0 | 0 | 0 | 0 | 0 | 0 | 0  | 0  | #  | 0  | #  | #  |

FIG.7

|    | 1 | 2 | 3 | 4 | 5 | 6 | 7 | 8 | 9 | 10 | 11 | 12 | 13 | 14 | 15 |
|----|---|---|---|---|---|---|---|---|---|----|----|----|----|----|----|
| 1  | # | # | 0 | # | 0 | 0 | 0 | 0 | 0 | 0  | 0  | 0  | 0  | 0  | 0  |
| 2  | # | # | # | 0 | # | 0 | 0 | 0 | 0 | 0  | 0  | 0  | 0  | 0  | 0  |
| 3  | 0 | # | # | 0 | 0 | # | 0 | 0 | 0 | 0  | 0  | 0  | 0  | 0  | 0  |
| 4  | # | 0 | 0 | # | # | 0 | # | 0 | 0 | 0  | 0  | 0  | 0  | 0  | 0  |
| 5  | 0 | # | 0 | # | # | # | 0 | # | 0 | 0  | 0  | 0  | 0  | 0  | 0  |
| 6  | 0 | 0 | # | 0 | # | # | 0 | 0 | # | 0  | 0  | 0  | 0  | 0  | 0  |
| 7  | 0 | 0 | 0 | # | 0 | 0 | # | # | 0 | #  | 0  | 0  | 0  | 0  | 0  |
| 8  | 0 | 0 | 0 | 0 | # | 0 | # | # | # | 0  | #  | 0  | 0  | 0  | 0  |
| 9  | 0 | 0 | 0 | 0 | 0 | # | 0 | # | # | 0  | 0  | #  | 0  | 0  | 0  |
| 10 | 0 | 0 | 0 | 0 | 0 | 0 | # | 0 | 0 | #  | #  | 0  | #  | 0  | 0  |
| 11 | 0 | 0 | 0 | 0 | 0 | 0 | 0 | # | 0 | #  | #  | #  | 0  | #  | 0  |
| 12 | 0 | 0 | 0 | 0 | 0 | 0 | 0 | 0 | # | 0  | #  | #  | 0  | 0  | #  |
| 13 | 0 | 0 | 0 | 0 | 0 | 0 | 0 | 0 | 0 | #  | 0  | 0  | #  | #  | 0  |
| 14 | 0 | 0 | 0 | 0 | 0 | 0 | 0 | 0 | 0 | 0  | #  | 0  | #  | #  | #  |
| 15 | 0 | 0 | 0 | 0 | 0 | 0 | 0 | 0 | 0 | 0  | 0  | #  | 0  | #  | #  |

FIG.8

|    | 1 | 2 | 3 | 4 | 5 | 6 | 7 | 8 | 9 | 10 | 11 | 12 | 13 | 14 | 15 |
|----|---|---|---|---|---|---|---|---|---|----|----|----|----|----|----|
| 1  | # | # | 0 | # | 0 | 0 | 0 | 0 | 0 | 0  | 0  | 0  | 0  | 0  | 0  |
| 2  | # | #B1# | # | 0 | #C1# | 0 | 0 | 0 | 0 | 0  | 0  | 0  | 0  | 0  | 0  |
| 3  | 0 | # | # | 0 | 0 | # | 0 | 0 | 0 | 0  | 0  | 0  | 0  | 0  | 0  |
| 4  | # | 0 | 0 | # | # | 0 | # | 0 | 0 | 0  | 0  | 0  | 0  | 0  | 0  |
| 5  | 0 | #A2# | 0 | # | #B2# | # | 0 | #C2# | 0 | 0  | 0  | 0  | 0  | 0  | 0  |
| 6  | 0 | 0 | # | 0 | # | # | 0 | 0 | # | 0  | 0  | 0  | 0  | 0  | 0  |
| 7  | 0 | 0 | 0 | # | 0 | 0 | # | # | 0 | #  | 0  | 0  | 0  | 0  | 0  |
| 8  | 0 | 0 | 0 | 0 | #A3# | 0 | # | #B3# | # | 0  | #C3# | 0  | 0  | 0  | 0  |
| 9  | 0 | 0 | 0 | 0 | 0 | # | 0 | # | # | 0  | 0  | #  | 0  | 0  | 0  |
| 10 | 0 | 0 | 0 | 0 | 0 | 0 | # | 0 | 0 | #  | #  | 0  | #  | 0  | 0  |
| 11 | 0 | 0 | 0 | 0 | 0 | 0 | 0 | #A4# | 0 | #  | #B4# | #  | 0  | #C4# | 0  |
| 12 | 0 | 0 | 0 | 0 | 0 | 0 | 0 | 0 | # | 0  | #  | #  | 0  | 0  | #  |
| 13 | 0 | 0 | 0 | 0 | 0 | 0 | 0 | 0 | 0 | #  | 0  | 0  | #  | #  | 0  |
| 14 | 0 | 0 | 0 | 0 | 0 | 0 | 0 | 0 | 0 | 0  | #A5# | 0  | #  | #B5# | # |
| 15 | 0 | 0 | 0 | 0 | 0 | 0 | 0 | 0 | 0 | 0  | 0  | #  | 0  | #  | #  |

FIG.9

$$\begin{bmatrix} B1 & C1 & 0 & 0 & 0 \\ A2 & B2 & C2 & 0 & 0 \\ 0 & A3 & B3 & C3 & 0 \\ 0 & 0 & A4 & B4 & C4 \\ 0 & 0 & 0 & A5 & B5 \end{bmatrix}$$

FIG.12

$$\left(\frac{k_i+k_{i-1}}{2\Delta x^2}\right)\phi_{i-1} - \left(\frac{k_{i+1}+2k_i+k_{i-1}}{2\Delta x^2}\right)\phi_i + \left(\frac{k_i+k_{i+1}}{2\Delta x^2}\right)\phi_{i+1}$$

$$+ \left(\frac{k_j+k_{j-1}}{2\Delta y^2}\right)\phi_{j-1} - \left(\frac{k_{j+1}+2k_j+k_{j-1}}{2\Delta y^2}\right)\phi_i + \left(\frac{k_j+k_{j+1}}{2\Delta y^2}\right)\phi_{j+1} = src_{i,j}$$

$src - A \cdot \phi = r$ $$\phi'_{corr} = A^{-1}_{uni} \cdot \left[\frac{r}{k}\right]$$

$$(\phi_{i+1} = \phi_i + \phi'_{i+1})$$
$$\phi = \phi_{old} + \phi'_{corr}$$

$$\begin{pmatrix} 19.889 \\ 15.446 \\ 12.527 \\ 17.488 \\ 14.897 \\ 12.386 \\ 16.021 \\ 14.319 \\ 12.2 \\ 15.166 \\ 13.891 \\ 12.043 \\ 14.77 \\ 13.67 \\ 11.956 \end{pmatrix} = \begin{pmatrix} 0 \\ 0 \\ 0 \\ 0 \\ 0 \\ 0 \\ 0 \\ 0 \\ 0 \\ 0 \\ 0 \\ 0 \\ 0 \\ 0 \\ 0 \end{pmatrix} + \begin{pmatrix} 19.889 \\ 15.446 \\ 12.527 \\ 17.488 \\ 14.897 \\ 12.386 \\ 16.021 \\ 14.319 \\ 12.2 \\ 15.166 \\ 13.891 \\ 12.043 \\ 14.77 \\ 13.67 \\ 11.956 \end{pmatrix}$$

FIG.19

$$\text{src} - A \cdot \phi = r$$

$$\phi'_{corr} = A_{uni}^{-1} \cdot \left[\frac{r}{k}\right]$$

$$\phi = \phi_{old} + \phi'_{corr}$$

$$\begin{pmatrix} 22.12 \\ 17.361 \\ 14.071 \\ 19.633 \\ 16.74 \\ 13.919 \\ 18.071 \\ 16.09 \\ 13.719 \\ 17.145 \\ 15.617 \\ 13.55 \\ 16.712 \\ 15.373 \\ 13.456 \end{pmatrix} = \begin{pmatrix} 19.889 \\ 15.446 \\ 12.527 \\ 17.488 \\ 14.897 \\ 12.386 \\ 16.021 \\ 14.319 \\ 12.2 \\ 15.166 \\ 13.891 \\ 12.043 \\ 14.77 \\ 13.67 \\ 11.956 \end{pmatrix} + \begin{pmatrix} 2.2309 \\ 1.9152 \\ 1.5438 \\ 2.1446 \\ 1.8438 \\ 1.5334 \\ 2.05 \\ 1.7709 \\ 1.5191 \\ 1.9793 \\ 1.7258 \\ 1.5072 \\ 1.9424 \\ 1.7026 \\ 1.5006 \end{pmatrix}$$

FIG.22

$$src - A \cdot \phi = r$$

SIMULATION METHOD UTILIZING CARTESIAN GRID

BACKGROUND OF THE INVENTION

The present invention relates to a computerized simulation method suitable for fluid analysis for instance, more particularly to a method which can solve a nonuniform Poisson equation.

In a computerized simulation to analyze a fluid flowing in a given three-dimensional space, a mesh of the three-dimensional space is usually defined by utilizing a Cartesian grid, and at each grid point, the pressure, temperature and/or flow velocity of the fluid are calculated, wherein if the fluid can be considered as incompressible, the equation regarding the pressure is usually given as a Poisson equation. The Cartesian grid can be a rectangular Cartesian, cylindrical Cartesian and spherical Cartesian.

As a method to solve a Poisson equation, iterative methods such as Jacobi method, Gauss-Seidel method and SOR method have been known.

In a iterative method, usually, initial values are given firstly (step 1), and a computation is carried out (step 2), then a convergence test is carried out to determine whether or not the solution satisfies a judgment condition, and if the judgment condition is not satisfied, the step 2 is repeated until the solution satisfies the judgment condition (step 3).

In such a iterative method, when the size of the matrix to be calculated is increased, the solution becomes poorly-converged, and thereby a long computational time is required.

In recent years, therefore, an Algebraic Multigrid (AMG) Method is widely used. As well known in the art, the AMG method is a method extended so as to solve an unstructured grid in addition to an orthogonal grid, on the basis of the geometric multigrid method. Like the original multigrid method, the extended AMG method has a characteristic that the number of repetitions is independent of the mesh size. Currently, it is considered as the most high-speed solver for a simultaneous linear equation.

Thus, the AMG method has been widely employed in the commercially offered general-purpose solvers (e.g. "FLUENT" of Ansys, Inc, "STAR-CD" of CD-Adapco).

As a solver for a large-scale matrix, the AMG method is excel in the convergence, but a large memory size is required for the computer.

on the other hand, a Block-cyclic Reduction Algorithm is known as a direct method in which a large-scale matrix can be solved without requiring a large memory size and the convergence is to machine precision.

However, the Block-Cyclic Reduction Algorithm is premised on that the constant "k" in a Poisson equation (for example, the "k" in the expression (1) in claim 1) is a fixed value. If the values of the "k" is not a fixed value and accordingly it is impossible to put the "k" outside the Poisson matrix as a common coefficient, then the Block-cyclic Reduction Algorithm can not be used to obtain the solution directly.

In order to use a Block-cyclic Reduction Algorithm properly, the values of the "k" used in a simulation must be a fixed value. In other words, it is necessary to use an explicit method (to satisfy the courant-Friedrichs-Lewy (CFL) condition) and to decrease the time intervals (steps) of the computing. Therefore, there is a disadvantage such that the computational cost increases.

The above-mentioned CFL condition is a necessary condition such that the velocity of propagation of data during computing in a simulation or numerical analysis must be faster than the velocity of propagation of wave or physical value in the real phenomenon to be simulated.

For instance, in the case that a wave motion in a discrete lattice system should be dealt with in the simulation, the values of the time intervals (at) used in solving of the motion equation for the numerical solution must be smaller than the time required for the real wave motion to progress between the adjacent grid units or cells.

If the value of Δt exceeds the upper limit determined by the CFL condition, then numerical divergence occurs, and it becomes impossible to obtain a sensible solution.

If the grid spacings are decreased in order to make a detailed simulation or analysis, the upper limit for the time step also decreases.

In the case of an advection equation, the CFL condition is given as $$\Delta x/\Delta t > C$$

wherein
Δx is a grid spacing,
Δt is the computational time interval, and
C is the velocity of real wave (or characteristic velocity).

This CFL condition becomes a condition to be used when a temporal progress is made in an explicit method.

In order to avoid the use of such condition, an implicit method is often employed.

one such popular method is SIMPLE (Semi Implicit Method for Pressure Linked Equations) method which is offered by commercial softwares like FLUENT of Ansys Inc. or by StarCCM+ of CD-Adapco. This method requires sub-iterations and all the Navier Stokes variables like velocity field and pressure field are corrected and updated to latest values for current time level. Since the gradients of velocity field required to update solution to next level are no longer the values of previous time level, the solution is essentially an implicit type method. For this reason, solution is numerically stable even for very large values of time step sizes.

SUMMARY OF THE INVENTION

It is therefore, an object of the present invention to provide a simulation method utilizing a Cartesian grid in which, even if the Cartesian grid is nonuniform and Poisson equation is nonuniform (K is not a fixed vale), by the use of a Block-Cyclic Reduction Algorithm, the Poisson equation can be solved rapidly even by a computer with a small memory size.

According to the present invention, a simulation method utilizing a Cartesian grid comprises a process in which a Cartesian grid model of a two-dimensional or three-dimensional space discretized with a Cartesian grid is defined, a process in which a Poisson equation $$\nabla[k\nabla\phi] = \text{src} \qquad \text{expression (1)}$$

(k: a constant defined for each cell individually,
φ: a variable to be calculated, and src: a source term)
is defined based on a physical value and condition associated with the Cartesian grid model, and a calculating process in which the above-mentioned physical value is calculated based on the Poisson equation, wherein, the calculating process comprises an error calculating step of calculating an error which is defined as $$\bar{k}[\nabla\nabla\phi']_{i+1} = \text{src} - \nabla[k\nabla\phi]_i \qquad \text{expression (2)}$$

($\bar{k}$: the average value of the values of "k" across all the cells,
i: the number of iteration, $\phi'_{i+1}$: a correction parameter added to the current value $\phi_i$ to produce $\phi_{i+1}$ to be used in the next iteration computation (namely, $\phi_{i+1}=\phi_i+\phi'_{i+1}$)
by using a Block-cyclic Reduction Algorithm,
a testing step of testing whether the calculated error is within a predetermined acceptable range or not, and
an error correcting step of correcting the variable $\phi$ by the use of an correction parameter if the calculated error is outside the predetermined acceptable range, and
the above-mentioned calculating process repeats the error calculating step, testing step and error correcting step until the error becomes within the predetermined acceptable range, whereby the Poisson equation is solved approximately.

The Block-cyclic Reduction Algorithm is a direct method in which the solution having almost no error can be obtained by one time computation under ordinary circumstances. However, a Poisson equation whose constant "k" is not a fixed value and which does not satisfy the conditions of application of the Block-cyclic Reduction Algorithm, can not be solved by the Block-cyclic Reduction Algorithm.

In the present invention, therefore, the concept of error is adopted, and in order to decrease the error, a computation of the error using a Block-cyclic Reduction Algorithm, and a correction of the error are repeated.

In other words, by utilizing the Block-cyclic Reduction Algorithm, it makes is possible to solve the Poisson equation with few time iterative computation.

As a result, it becomes possible to solve a Poisson equation with a computer with a small memory size.

Further, since an implicit method can be applied, it becomes possible to make an unsteady computation at relatively long computational time intervals. Therefore, an analysis of airflow involving a complicated disturbed flow is possible at high spacial resolution and high temporal resolution. Thus, the simulation method according to the present invention is very useful for reducing the computational cost, and development of products, for example the improvement of the dimples of a golf ball.

Furthermore, the Block-cyclic Reduction Algorithm is used, the number of iteration becomes small, therefore, the accumulation of computational errors on the computational result due to the cancellation of significant digits and the like becomes small. As a result, the computational accuracy can be improved.

BRIEF DESCRIPTION OF THE DRAWINGS

The patent or application file contains at least one color drawing. Copies of this patent or patent application publication with color drawing will be provided by the USPTO upon request and payment of the necessary fee.

FIG. 7 is the matrix shown in FIG. 6 for explaining submatrixes defining as blocks.

FIG. 8 is the matrix shown in FIG. 7 in which indexes are given to the blocks.

FIG. 9 shows a 5-by-5 triple diagonal matrix equivalent to the matrix shown in FIG. 8 defined by 3-by-3 submatrixes.

FIG. 12 shows a general expression used in the finite difference method.

FIG. 13 shows an equation of the finite difference method in the first case (k=1) shown in FIG. 4(a).

FIG. 14 shows an equation rewritten from the equation shown in FIG. 13.

FIG. 16 is an equation rewritten from the equation shown in FIG. 14 into a format for calculating the error (r).

FIG. 17 is an equation for calculating the correction parameter $\phi'corr$ for correcting the error to reduce the error.

FIG. 18 shows a computational result of $\phi$.

FIG. 19 shows a computational result of the error (r) at the second iterative computation.

FIG. 20 shows a computational result of the correction parameter $\phi'corr$ at the second iterative computation.

FIG. 21 shows a computational result of $\phi$ at the second iterative computation.

FIG. 22 shows the computational result of the error (r) at the third iterative computation.

DESCRIPTION OF THE PREFERRED EMBODIMENTS

Embodiments of the present invention will now be described in detail in conjunction with accompanying drawings.

Figure 1:
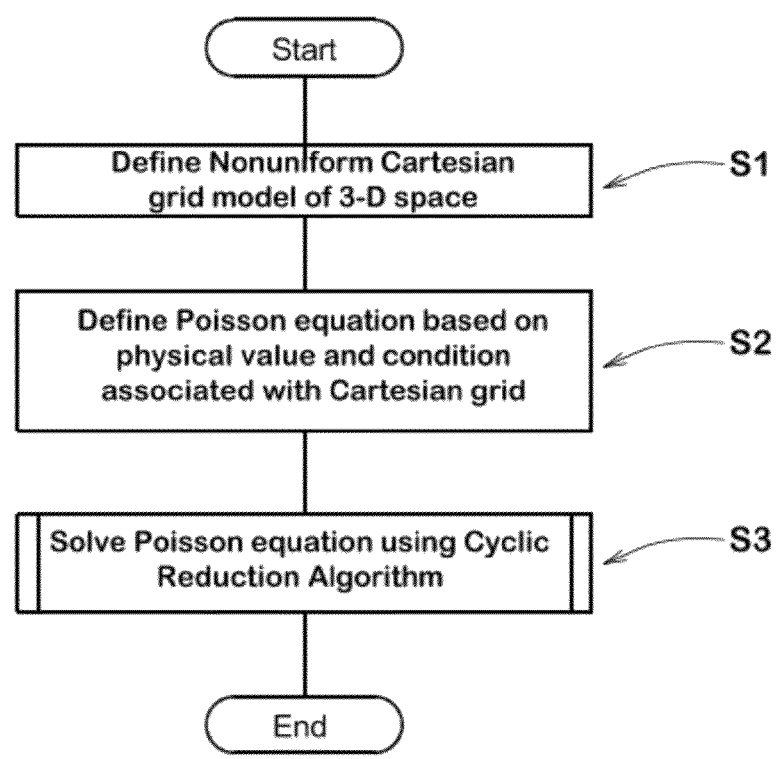
FIG. 1 is a flow chart showing an exemplary computational procedure of a simulation method according to an embodiment of the present invention.

FIG. 1 is a flow chart showing the outline of the simulation method according to an embodiment of the present invention.

The simulation method is executed by a computer and in this embodiment comprises a process (S1) in which a model of a two-dimensional or three-dimensional space (in FIG. 1, three-dimensional space) is defined as a Cartesian grid, wherein
the above-mentioned Cartesian grid can be
a uniform Cartesian grid composed of uniform cells or
a nonuniform Cartesian grid composed of nonuniform cells,
a process (s2) in which a Poisson equation is defined by a characteristic formula based on a physical value and condition associated with the Cartesian grid model,
a process (s3) in which the Poisson equation is solved in order to calculate the above-mentioned physical value.

For the above-mentioned two-dimensional or three-dimensional space, an Cartesian coordinate system, cylindrical coordinate system or polar coordinate system can be employed, for instance.

In the coordinate system employed in the two-dimensional or three-dimensional space, the Cartesian grid model is defined as Euler mesh, for instance.

Those data are stored in the computer (not shown).

The model has cells or spaces divided by the grid, and boundary conditions, variables and the like are assigned thereto.

In the case of a fluid simulation, the model represents a flow field of the fluid.

From such Cartesian grid model, desired physical values at each grid point, e.g. pressure, flow velocity and the like are calculated.

Figure 2A:
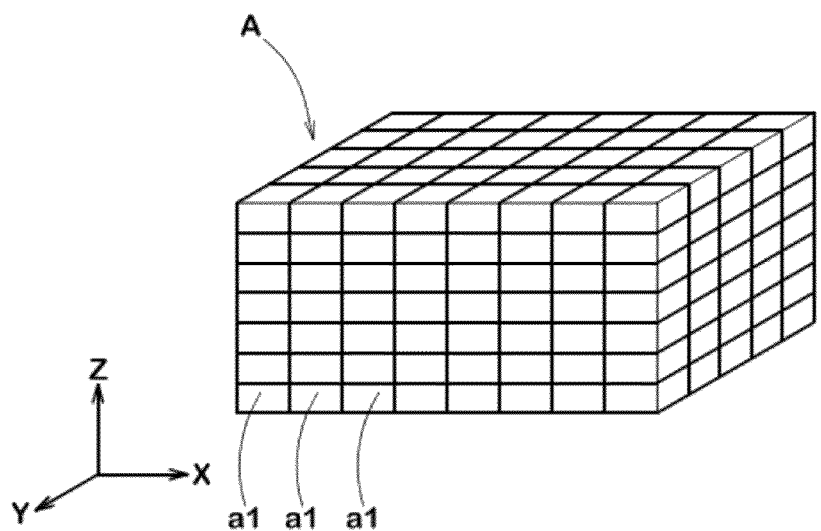
FIG. 2(a) is a perspective view for explaining a uniform Cartesian grid.

In this specification and claims, as shown in FIG. 2(a), the "uniform Cartesian grid" means such a Cartesian grid in which the grid spacings taken in the direction of the axis of each dimension are constant.
For example, in the case of Cartesian coordinates,
the grid spacings in the x-axis direction are constant,
the grid spacings in the Y-axis direction are constant, and
the grid spacings in the z-axis direction are constant.
Thus, all of the cells (a1) are provided with the same shape and the same volume.

Figure 2B:
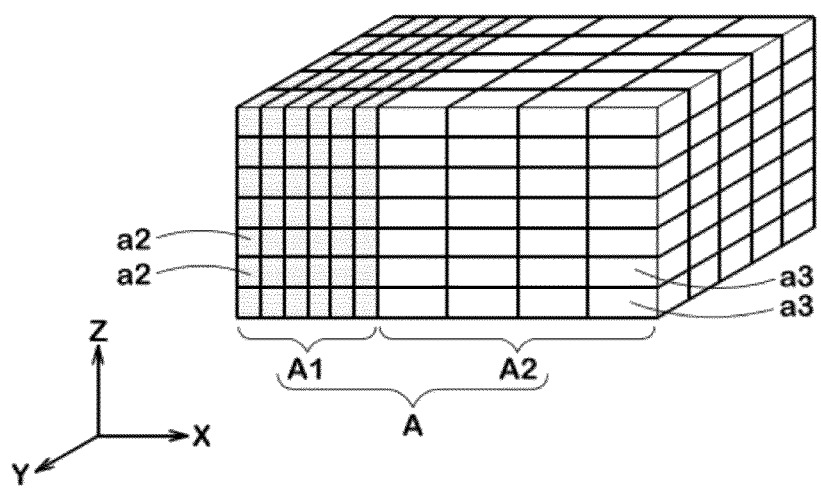
FIG. 2(b) is a perspective view for explaining a nonuniform Cartesian grid.

On the other hand, the "nonuniform Cartesian grid" means such a Cartesian grid in which
the grid spacings taken in the direction of the axis of at least one of the dimensions are not constant as shown in FIG. 2(b).
In the Cartesian coordinate system shown in FIG. 2(b), the grid spacings are constant in each of the Y-axis direction and z-axis direction, but the grid spacings in the x-axis direction are not constant. As a result, the cells include two types of cell a2 and a3 having different sizes.

In the case of the nonuniform Cartesian grid, it is possible that a specific space A1 for which minute analysis is desired is modeled by relatively-small cells a2, and a specific space A2 for which minute analysis is not necessary is modeled by relatively-large cells a3.
Therefore, the computational cost can be reduced while maintaining the necessary computational accuracy.

As explained, the present invention can be applied to both of the uniform Cartesian grid ("k" is a fixed value) and the nonuniform Cartesian grid ("k" is not a fixed value).

In the process s2, the Poisson equation $$\nabla[k\nabla\phi]=src \qquad \text{Expression (1)}$$

is defined by the computer based on necessary parameters, boundary conditions and specifications of the Cartesian grid model entered by an operator.

The "$\phi$" in the expression (1) is a variable to be calculated. In the fluid simulation, the "$\phi$" may be the pressure P, three-components (u, v, w) of the velocity and the like. Anyway these variables are collectively expressed by the single symbol "$\phi$" here.

The "src" in the expression (1) is an abbreviation of "source term". In the fluid simulation, the "src" becomes the term of the mass flux which usually becomes a function f($\phi$) of the above-mentioned variable "$\phi$".

The "k" in the expression (1) is a constant given to each cell individually. In the case of the implicit method which needs not satisfy the CFL condition, the "k" can be nonconstant values.

The "k" can be expressed as $$k=\text{vol}/Ap$$

wherein
"vol" is the volume of the cell concerned,
"Ap" is diagonal elements of the momentum equation.
The "Ap" is a function of the mass flux.

In the case of a fluid simulation, the "Ap" can be expressed as $$Ap=-(A_E+A_W)+\rho/\Delta t$$

wherein
$A_E=(\rho u/2\Delta x)-(\Gamma/\Delta x^2)$
$A_W=-(\rho u/2\Delta x)-(\Gamma/\Delta x^2)$
"$\rho$" is the density of the fluid (constant under sonic speed),
"u" is the velocity of the fluid,
"$\Gamma$" is the viscosity of the fluid.
(cf. "Computational Methods for Fluid Dynamics 3rd Edition" written by J. H. Ferziger, M. Peric, for instance)

The "Ap" is a function of the velocity (u) of the fluid. In the space, the velocity (u) has a nonuniform distribution as long as the flow is not a smooth flow. Accordingly, the "k" becomes not a fixed value.

On the other hand, in the explicit method, $$k=\rho/Ap,$$

and $$Ap=\rho/\Delta t.$$

Accordingly, $$k=\Delta t.$$

Usually, the time intervals $\Delta t$ are kept constant at all times, therefore, the "k" becomes a fixed value.

In the case that a fluid simulation in a three-dimensional space to which a Cartesian grid is applied is to be solved by the implicit method, the "Ap" can be obtained as follows.

Figure 3A:
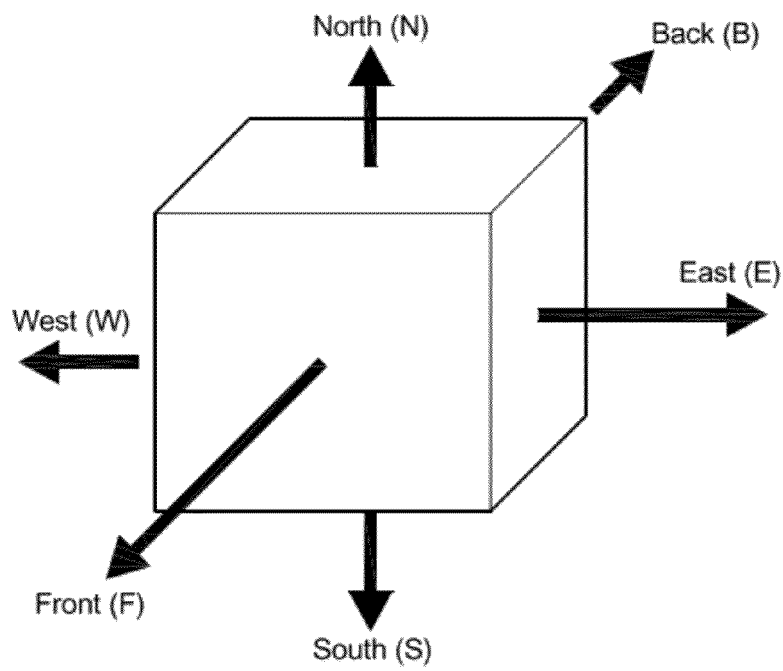
FIG. 3(a) is a perspective view of one cell of a three-dimensional Cartesian grid.

Each cell has six adjacent cells, namely, North (N), South (S), west (W), East (E), Front (F) and Back (B) cells as shown in FIG. 3(a).

Figure 3B:
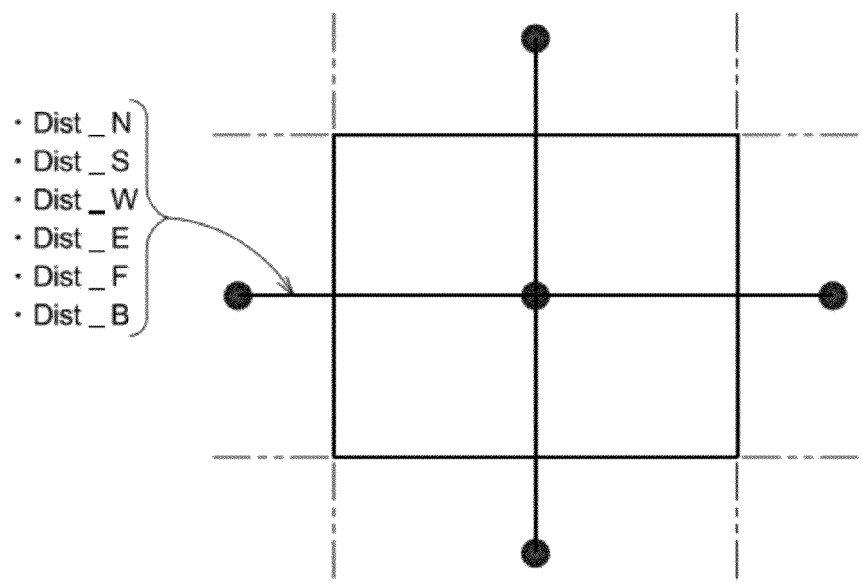
FIG. 3(b) is a front view thereof.

The distance from the concerned cell to each of the six adjacent cells measured between the centers (black dots) of the cells is expressed as
"Dist_" and an initial letter (N,S,W,E,F,B) in parenthesis as shown in FIG. 3(b)

The six surfaces of the concerned cell facing in the N, S, W, E, F and B directions each have a surface area and a fluid velocity at the centroid of the surface area, wherein the surface area is expressed as
"Area_" and an initial letter (N,S,W,E,F,B), and the fluid velocity is expressed as
"Velocity_" and an initial letter (N,S,W,E,F,B).
The mass flow rate at each of the six surfaces is expressed as
"Flux_" and an initial letter (N,S,W,E,F,B).
So, the mass flow rates are $$\text{Flux}\_N=\rho\times\text{Area}\_N\times\text{Velocity}\_N$$

$$\text{Flux}\_S=\rho\times\text{Area}\_S\times\text{Velocity}\_S$$

$Flux\_W = \rho \times Area\_W \times Velocity\_W$ $Flux\_E = \rho \times Area\_E \times Velocity\_E$ $Flux\_F = \rho \times Area\_F \times Velocity\_F$ $Flux\_B = \rho \times Area\_B \times Velocity\_B.$ If the flow velocities do not have identical values, then the mass flow rates also do not have identical values. The off diagonal elements A_*(*: N,S,W,E,F,B) are $A\_N = -\Gamma \times (Area\_N/Dist\_N) + Min(Flux\_N, 0)$ $A\_S = -\Gamma \times (Area\_S/Dist\_S) + Min(Flux\_S, 0)$ $A\_W = -\Gamma \times (Area\_W/Dist\_W) + Min(Flux\_W, 0)$ $A\_E = -\Gamma \times (Area\_E/Dist\_E) + Min(Flux\_E, 0)$ $A\_F = -\Gamma \times (Area\_F/Dist\_F) + Min(Flux\_F, 0)$ $A\_B = -\Gamma \times (Area\_B/Dist\_B) + Min(Flux\_B, 0)$ wherein
"Γ" is the viscosity of the fluid, and
"Min(arg.)" is a function which returns the argument if it is negative or 0 (zero) if the argument is positive.

Using the above-mentioned variables, in the case that the Cartesian grid is three-dimensional, the "Ap" may be expressed as $Ap = -1 \times (A\_N + A\_S + A\_W + A\_E + A\_F + A\_B).$ When all of the surfaces do not have identical mass flux, all of the cells do not have identical Ap, therefore, the "k" becomes not a fixed value.

In the case of the explicit method, $k = \rho/Ap,$ $Ap = \rho/\Delta t,$ and $k = \Delta t = constant,$ therefore, it is possible to put the "k" outside the Poisson equation. In this case, accordingly, the Poisson equation can be expressed in a form not containing the "k" as follows $$\nabla [\nabla \phi] = \frac{1}{k} src. \qquad \text{expression (3)}$$

In the case of the implicit method, $k = vol/Ap,$ and $Ap = -(A_E + A_W) + \rho/\Delta t,$ therefore, the "Ap" becomes a function of the flow velocity (u). Since the velocity is usually varied according to the positions, the "k" is not a fixed value. Accordingly, the "k" can not be placed outside the Poisson equation.

In the new method according to the present invention, an approximate calculation of a Poisson equation such as the expression (1) is possible at short times. In particular, in order to approximately solve the Poisson equation, the Block-cyclic Reduction Algorithm is used in a manner analogous to the iterative method (calculating process S3).

As explained, the Block-cyclic Reduction Algorithm is a direct method in which a solution containing almost no error can be obtained by one time computation. But, the Poisson equation in which the "k" is not a fixed value can not be solved by the Block-cyclic Reduction Algorithm in a straightforward manner.

Therefore, in this invention, the concept of error is adopted. And the error is calculated iteratively by the use of the Block-cyclic Reduction Algorithm, and gradually decreased by correction. In other words, by utilizing the cyclic reduction method, the Poisson equation in which the "k" is not a fixed value can be solved by few time iterative computation.

Hereinafter, a concrete example will be explained together with the reason why the Block-cyclic Reduction Algorithm can not be applied to the implicit method in a straightforward manner.

Figure 4A:
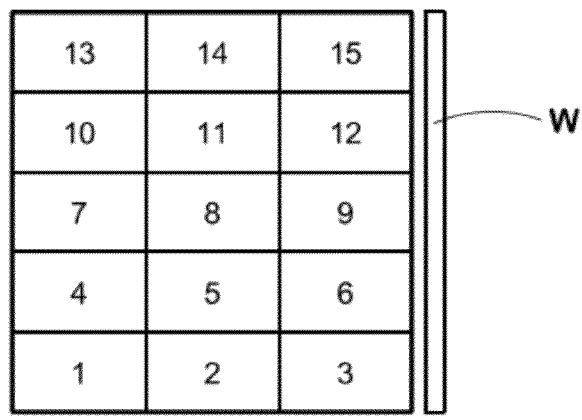
FIG. 4(a) is an example of a two-dimensional Cartesian grid for explaining the present invention.

FIG. 4(a) shows an example of a two-dimensional space which is divided into fifteen cells as a 3-by-5 Cartesian grid. As shown, index numbers are assigned to the respective cells. The domain of this two-dimensional space is one-meters square.

Figure 4B:
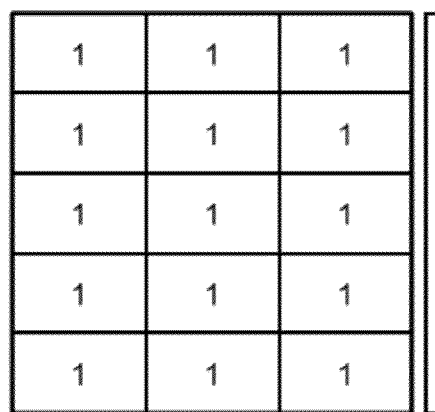
FIG. 4(b) is an example of the uniform Cartesian grid.
Figure 4C:
FIG. 4(c) is an example of the nonuniform Cartesian grid.

In the following two cases, Poisson equation is defined: the first case is a model of a uniform Cartesian grid as shown in FIG. 4(b), and the second case is a model of a nonuniform Cartesian grid as shown in FIG. 4(c).

Here, an intent is to show that this example problem can not be solved by using the Block-cyclic Reduction Algorithm if the "k" is not a fixed value.

This example problem used is such that for the rightmost boundary w of the Cartesian grid, a condition of a fixed value (=10.0) is defined, and to the remaining three boundaries, zero gradient is given.

Further, as the source term, −100 is defined for cell #1, and 0 (zero) is defined for other cells #2-#15.

Incidentally, this example problem is merely for a matrix calculation, not a reproduction of an actual physical phenomenon.

Further, the "k" is defined as follows.

In the first case (uniform Cartesian grid), the "k" is a fixed value, and 1 (one) is defined for each cell as shown in FIG. 4(b).

In the second case (nonuniform Cartesian grid), the "k" is not constant, and as shown in FIG. 4(c), 0.75 is defined for central cells, and 1.0 is defined for the remaining cells on both sides thereof.

Figures 5, 6:
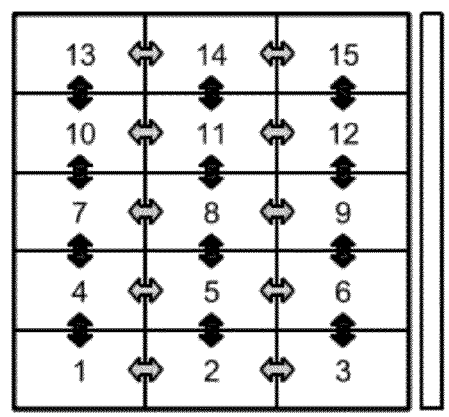
FIG. 5 shows mutual relationships of the matrix elements of the Cartesian grid shown in FIG. 4(a).
FIG. 6 is a matrix showing a pattern showing the relationships of the Cartesian grid shown in FIG. 5.

In FIG. 5, the arrows each represent mutual elements of the undermentioned matrix of the Poisson equation to be solved hereunder.

FIG. 6 shows the matrix showing a pattern showing the relationships of the Cartesian grid shown in FIG. 5, wherein the numerals of the vertical axis and horizontal axis denote the above-mentioned index numbers of the cells.

In the matrix shown in FIG. 6, nonzero elements indicated by "#" which correspond to the above-mentioned arrows.

The matrix shown in FIG. 6 includes a plurality of 3-by-3 submatrixes as shown in FIG. 7. Each submatrix is referred to as "block" hereinafter. These blocks are indexed as shown in FIG. 8.

The matrix of FIG. 8 divided into 3-by-3 blocks is equivalent to a 5-by-5 triple diagonal matrix shown in FIG. 9. Therefore, the equation shown in the FIG. 10(a) is equivalent to the equation shown in FIG. 10(b).

Figure 10:
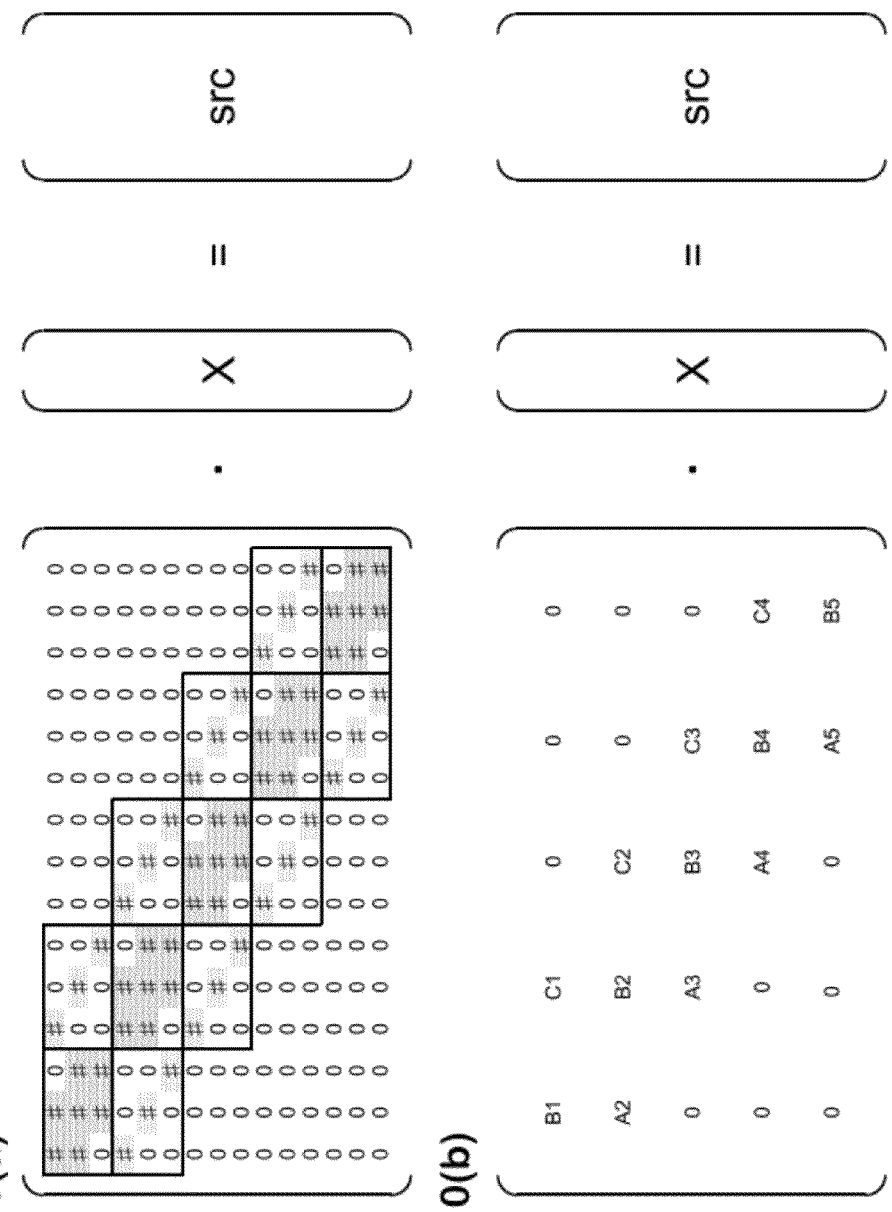
FIG. 10(a) and FIG. 10(b) show equivalent equations expressed by the use of the above-mentioned matrixes.

In order to solve the equation of FIG. 10(b), a finite difference method (FDM) is employed in this embodiment.

Figure 11:
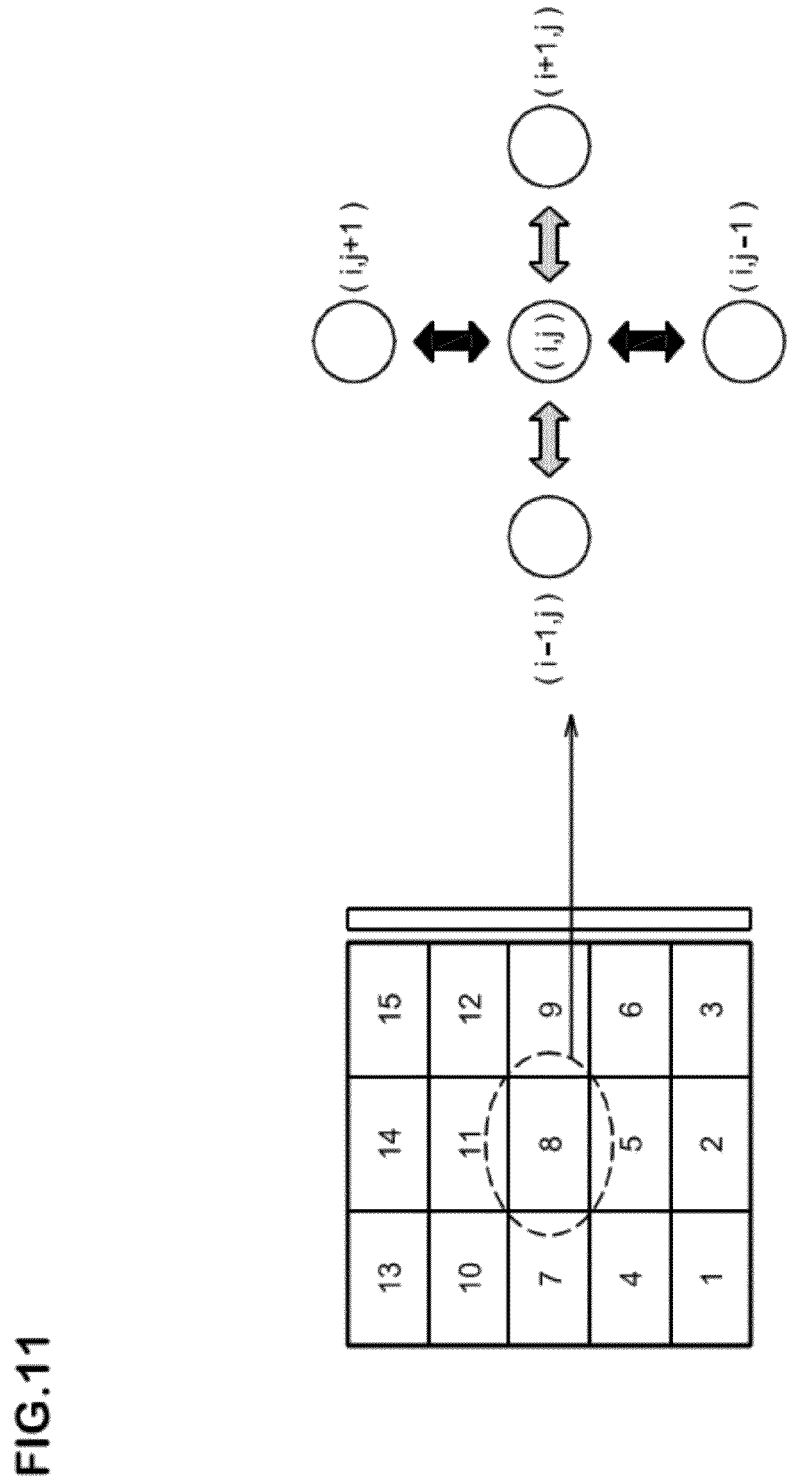
FIG. 11 is a diagram for explaining a finite difference method.

In the finite difference method, as shown in FIG. 11 for instance, with respect to each cell, a relationship between the concerned cell and each cell abutting thereon is considered. In the case of the cell #8 for instance, the relationship between the cell #8 and each of the cells #5, #7, #9 and #11 is considered.

In the finite difference method, there is used a general expression shown in FIG. 12. (Such general expression appears, for example, at page 50 of "Computational methods for fluid dynamics" written by Ferziger J H peric.)

In this example problem, as the domain of the two-dimensional, 3-by-5 Cartesian grid model is one-meters square, $$\Delta x=1 \text{ m}/3 \approx 0.333333 \text{ m},$$

and $$\Delta y=1 \text{ m}/5=0.2 \text{ m}.$$

Using these values and the above-mentioned boundary conditions, in the first case (k=1) shown in FIG. 4(b), the Poisson equation can be expressed as shown in FIG. 13.

Figure 14:
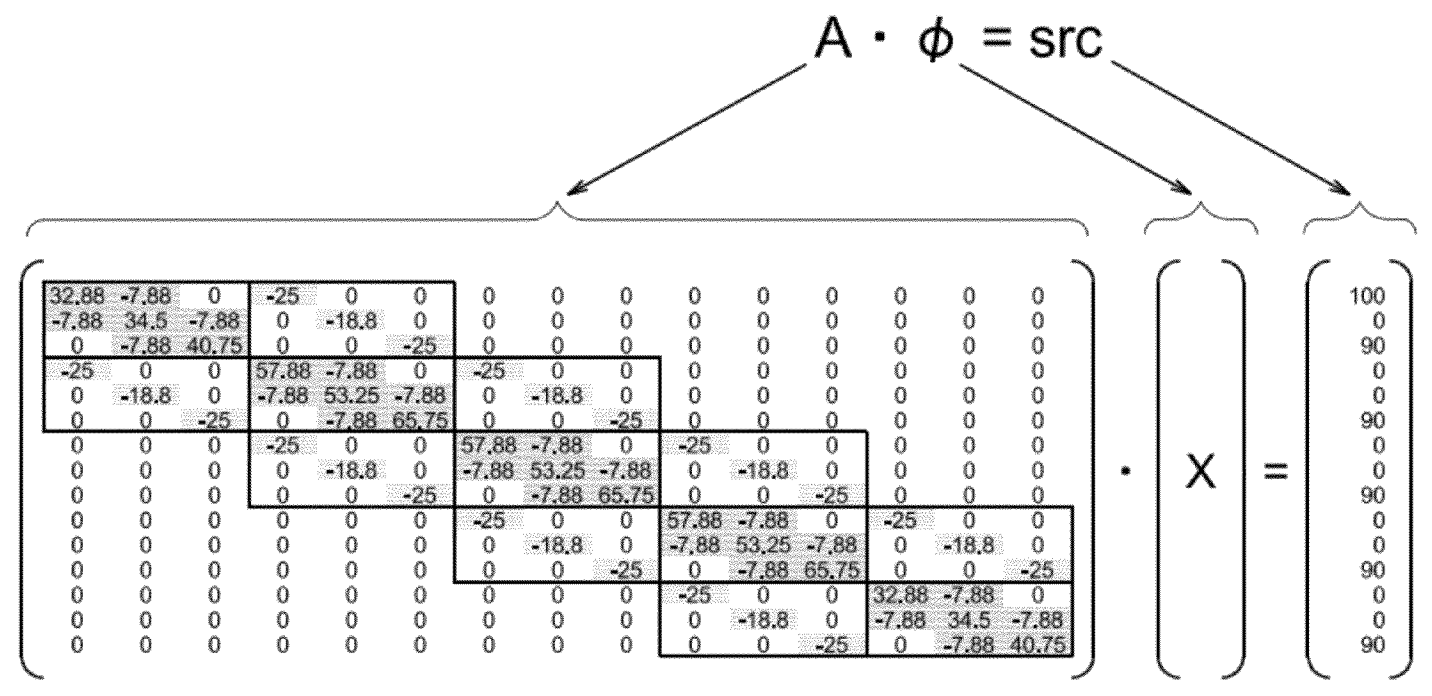

In the second case shown in FIG. 4(c), the Poisson equation can be expressed as shown in FIG. 14.

As shown, in the first case, diagonal blocks (corresponding to the blocks A2-A5 in FIG. 8) can be expressed in the form of $$Ai = ai \times I$$

wherein, ai is a scalar, and I is a unit matrix.

In the second case (FIG. 14), however, the blocks A2-A5 as diagonal terms can not be expressed in the form of $$Ai = ai \times I.$$

In order that the (block) cyclic reduction method can be applied to the equation, it is necessary for the equation to meet the following three conditions 1-3. In particular, the blocks A-C need to be in the following forms.

$$Ai = ai \times I \quad \text{conditions 1:}$$

$$Bi = B + bi \times I \quad \text{conditions 2:}$$

$$Ci = ci \times I \quad \text{conditions 3:}$$

wherein, ai, bi and ci are scalars, and I is a unit matrix.
(In this regard, see "A Direct Method for the Discrete Solution of Separable Elliptic Equations" written by Paul N Swarztrauber, for instance.)

Next, it is discussed whether the first case and second case satisfy the above-mentioned three conditions or not.

In the first case, the three conditions 1-3 are all satisfied, therefore, the Poisson equation for the uniform Cartesian grid (k is a fixed value of 1) can be solved by applying the cyclic reduction method thereto as a direct method.

However, in the second case (k is not a fixed value), the blocks A-C can not be transformed into the format of "scalar× unit matrix", and can not satisfy the three conditions 1-3. Therefore, the (block) cyclic reduction method as a direct method can not be applied to the nonuniform Cartesian grid.

In the present invention, therefore, the cyclic reduction method is utilized in a manner analogous to the iterative method and thereby nonuniform Poisson equation for such nonuniform Cartesian grid can be calculated rapidly.

Figure 15:
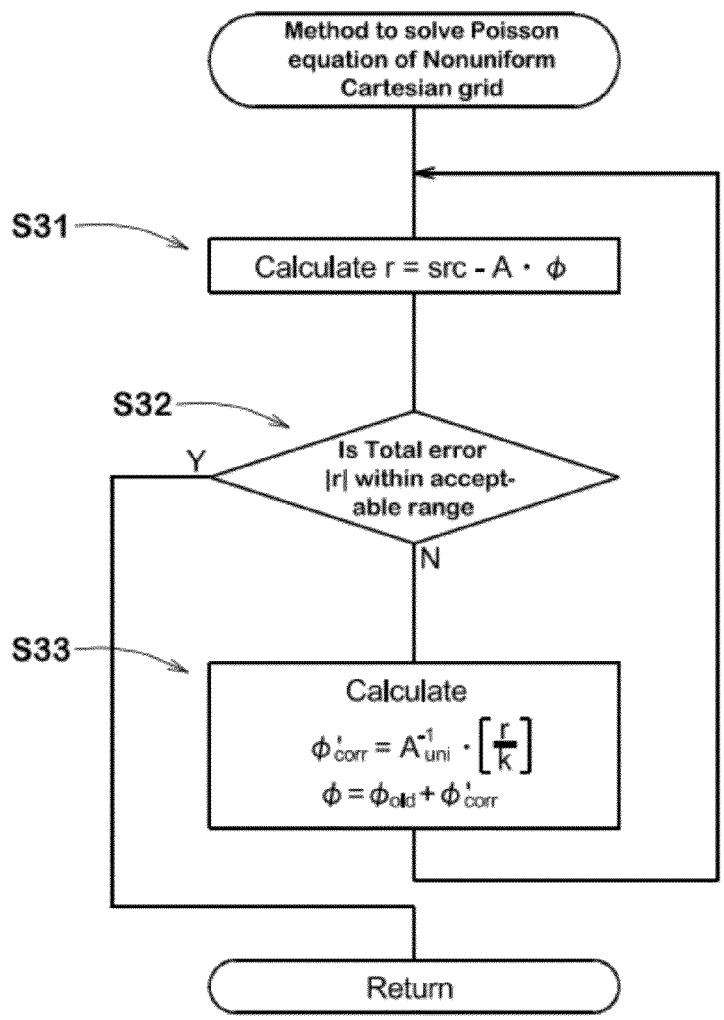
FIG. 15 is a flow chart showing a computational procedure for calculating the Poisson equation by using a cyclic reduction method.

An example of the computational procedure therefor is shown in FIG. 15.

As shown, firstly, the error (r) is calculated (step s31). Since the error (r) should become zero finally, the error (r) is defined as follows $$\text{error}(r) = \text{src} - A \cdot \phi \quad \text{expression (4)}$$

wherein
"src" is the above-mentioned source term,
"φ" is the variable,

"A" is the matrix of the Poisson equation (k is not a fixed value) shown in FIG. 14. (The expression (4) corresponds to the expression (2) in claim 1.)

As to the "φ", 0 (zero) is given to the "φ" in the first time computation. But, in the second time computation and the rest, the "φ" is given by $$\phi = \phi\text{old} + \phi'\text{corr} \quad \text{expression (5).}$$

(This expression (5) corresponds to $\phi_{i+1} = \phi_i + \phi'_{i+1}$ in claim 1)
Here, the "φold" is the previous calculated value of the "φ". The "φ'corr" is a correction parameter (in claim 1 expressed as $\phi'_{i+1}$) indicating a correcting quantity to reduce the above-mentioned error and defined as $$\phi'\text{corr} = A\text{uni}-1 \cdot [r/k\_\text{bar}] \quad \text{expression (6).}$$

(In the format used in claim 1, this correction parameter is defined as $$\nabla^2 \phi'_{i+1} = \frac{1}{\bar{k}}[src - \nabla[k\nabla\phi]_i] \quad \text{expression (7)}$$

wherein
k̄: the average value of the "k" across all of the cells,
i: the number of iteration,
$\phi'_{i+1}$: a correction parameter added to the current value $\phi_i$ to produce $\phi_{i+1}$ to be used in the next iteration computation, namely, $\phi_{i+1} = \phi_i + \phi'_{i+1}$).

In the expression (6), the "k_bar" is the average value of the "k" across all of the cells.

The "Auni−1" is the inverse matrix of the matrix A of the uniform Cartesian grid in the first case shown in FIG. 13 (namely, the matrix of the uniform Cartesian grid in the first case which is the same as the second case in respect of the boundary conditions, the division numbers of the grid and the like but differ therefrom in respect of only the "k" being a fixed value.)

In this computational expression (6) of the "φ'corr", since the above-mentioned matrix A satisfies all the conditions 1-3 of application of the cyclic reduction method, the matrix Auni−1 as the inverse matrix thereof also satisfies all the conditions 1-3 of application.

Therefore, in the computation of the above-mentioned correction parameter "φ'corr", the cyclic reduction method as a direct method can be applied, therefore, an accurate solution of the correction parameter can be obtained by one time computation.

Figure 16:
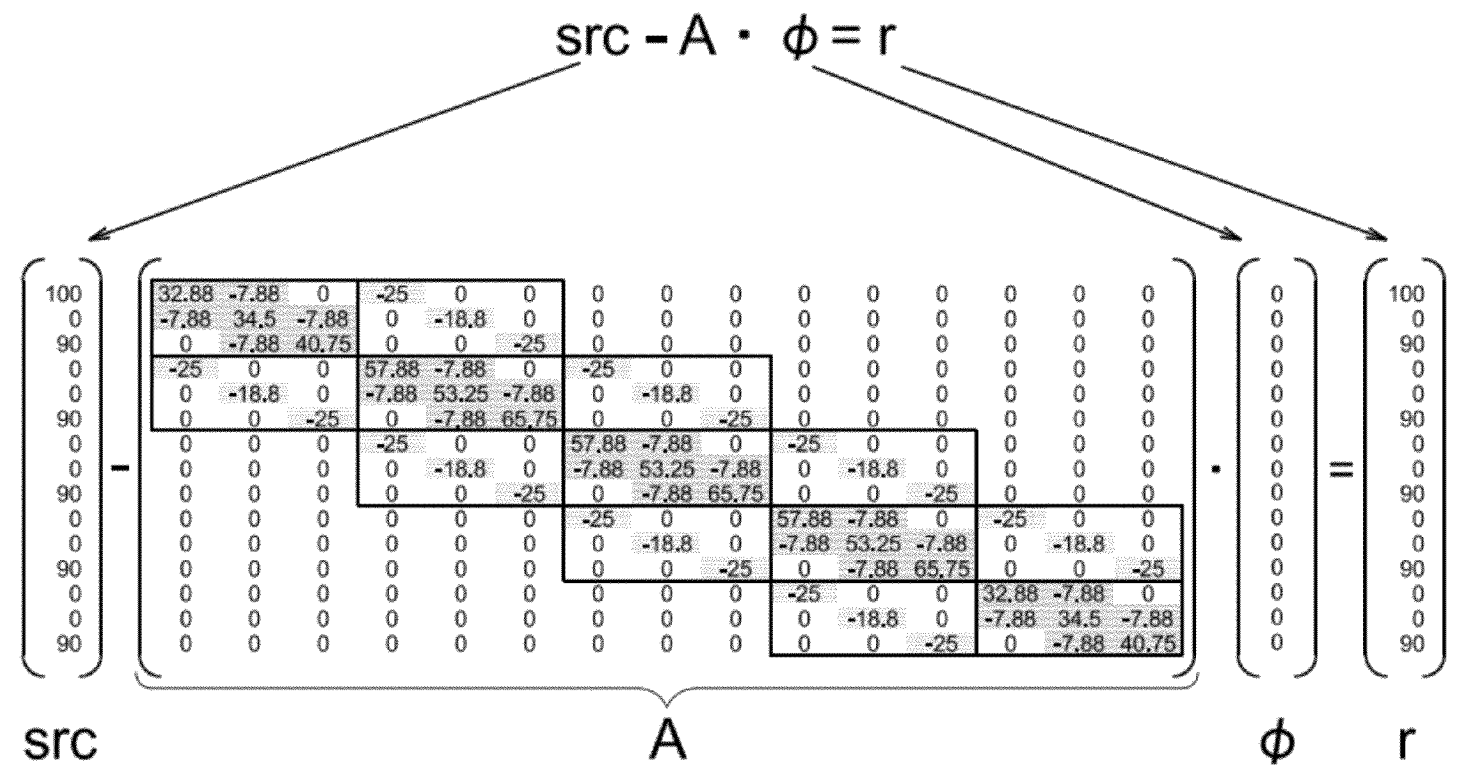

As shown in the equations shown in FIG. 14 and FIG. 16, by the first time computation, the error (r) becomes equal to the source term. In this example problem, the summation Σ|ri| of the error (r) is 100+90×5=550.

In the next step in this embodiment, it is checked whether the summation Σ|ri| of the error (r) is within a predetermined acceptable range or not. (step s32)

If within the acceptable range (if "Y" in step s32), the computational procedure is ended.

Figure 17:
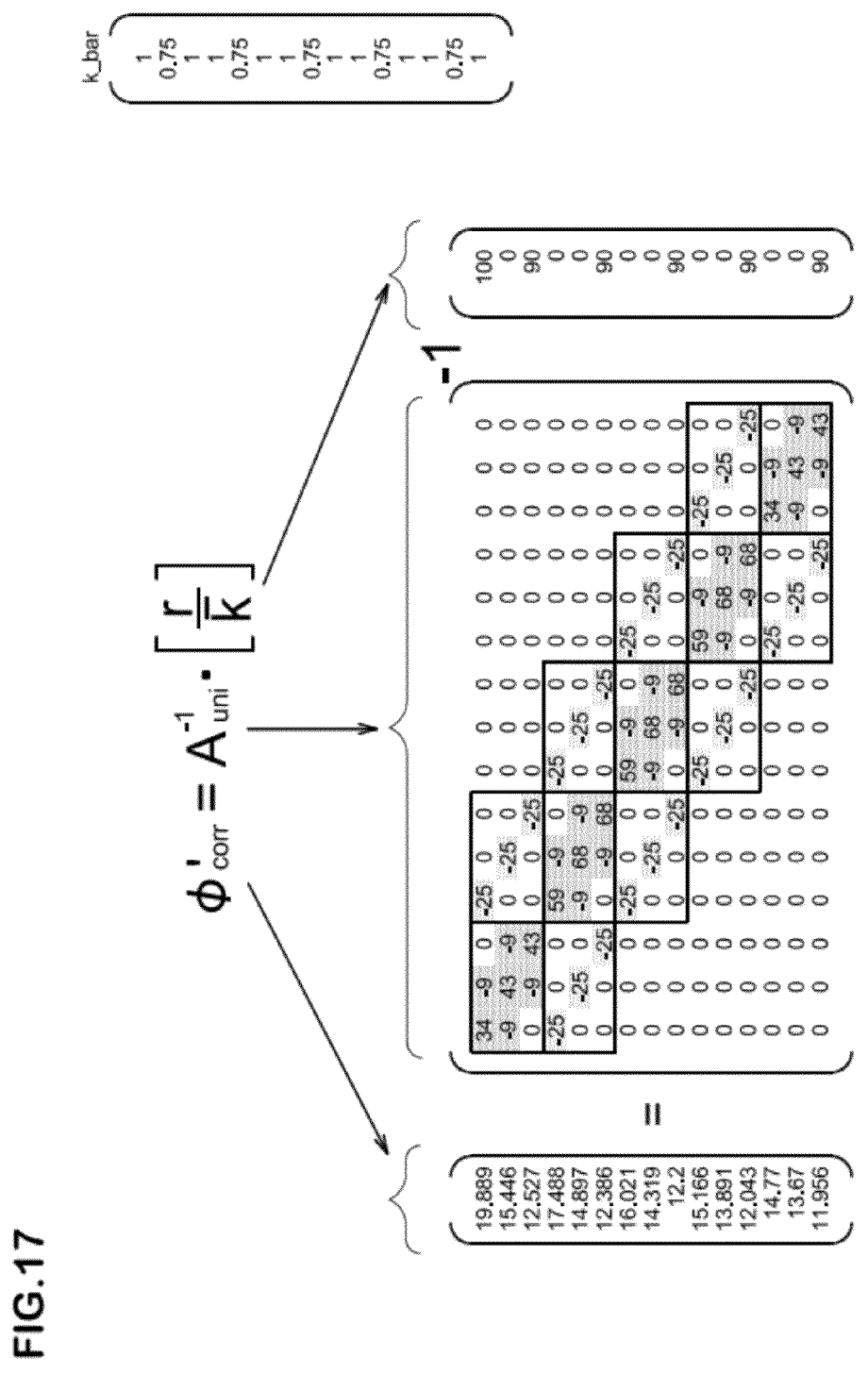

If the summation Σ|ri| of the error (r) is outside the acceptable range (if 'N' in step s32), according to the above-mentioned expression, the "φ'corr" and new φ are calculated, and then returning to the step s31, the error (r) is again calculated. Such equation is shown in FIG. 17.

The computational results of the variable φ is shown in FIG. 18.

Until the summation of the error (r) becomes within the acceptable range, the above-explained steps are repeated.

Figure 19:
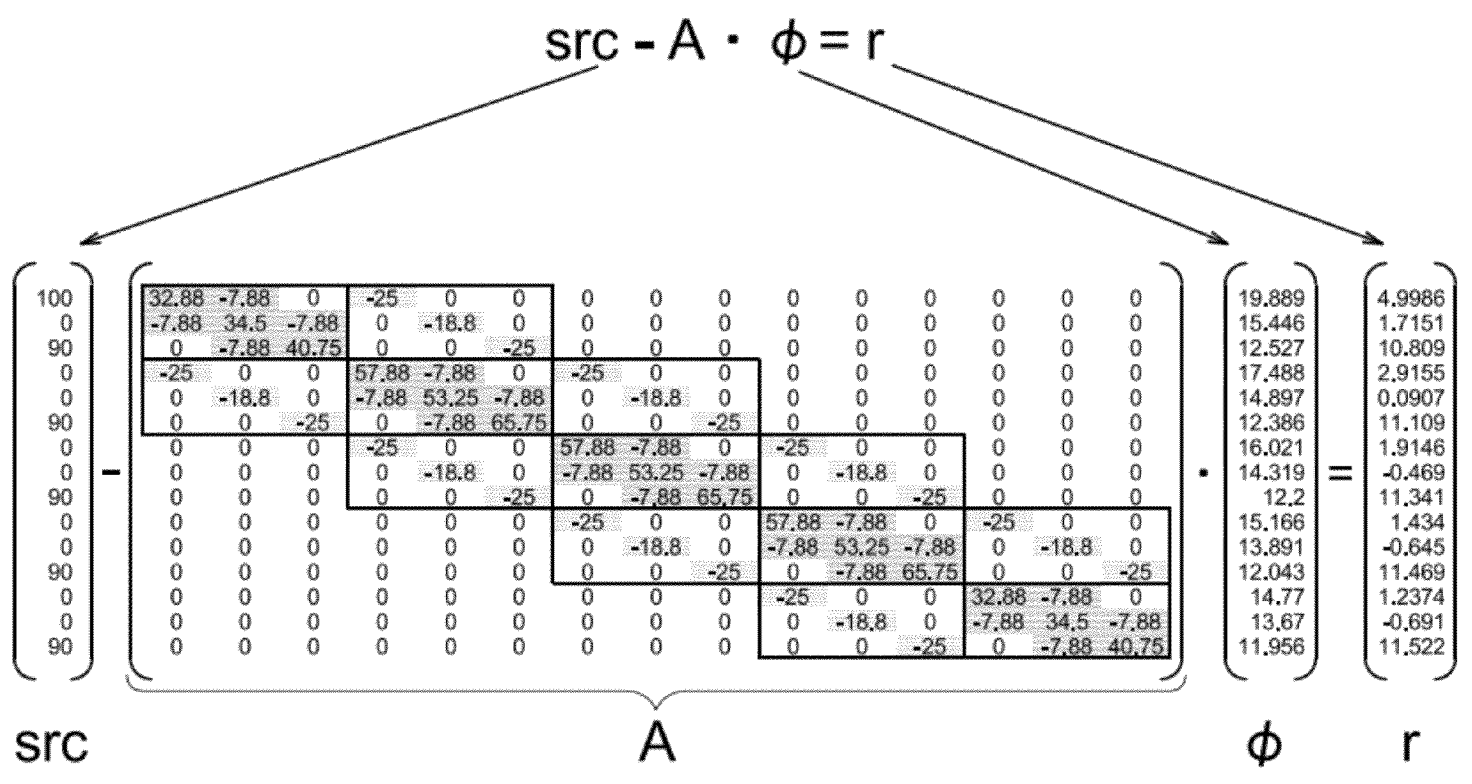
Figure 20:
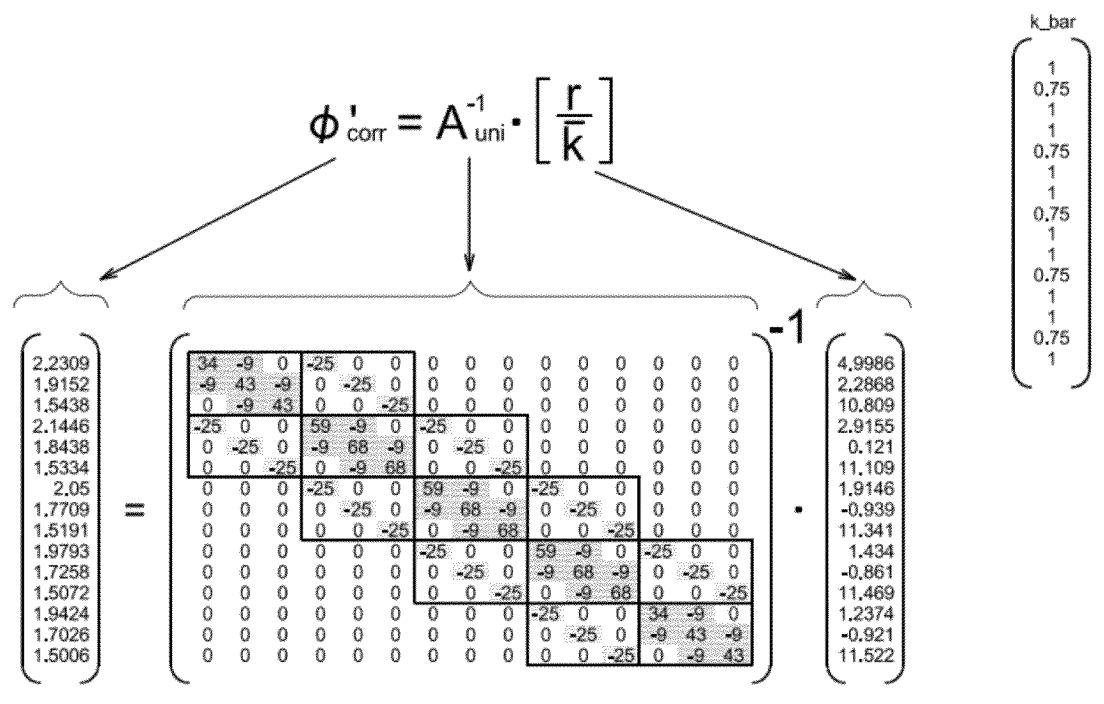

FIGS. 19-21 show the results after the second iterative computation is done. At this time, the summation of the error (r) is 68.7509.

Figure 22:
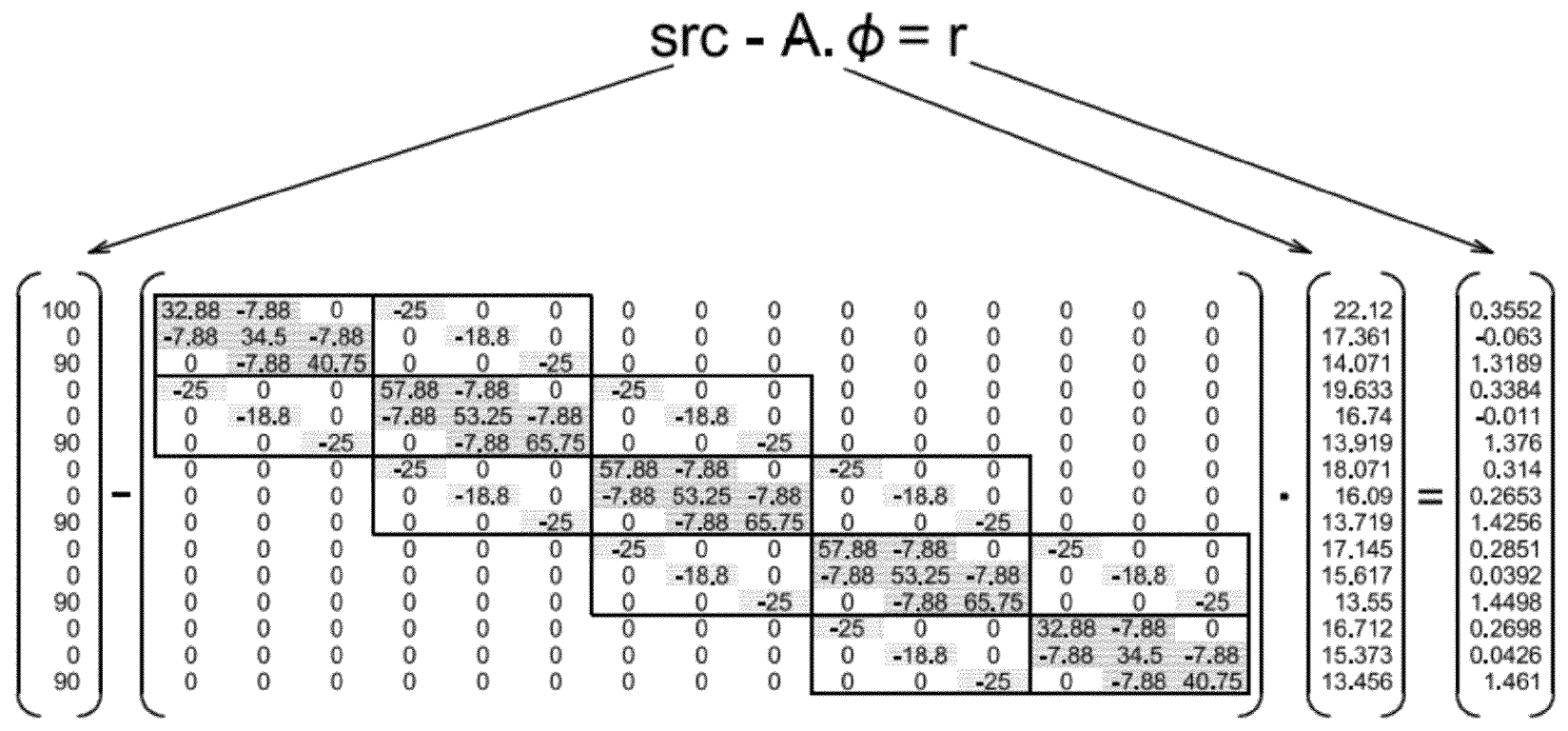

FIG. 22 shows the computational expression of the error (r) after the third iterative computation is done. At this time, the summation of the error (r) is 8.8669.

As shown, by making only three time computations, it is possible to greatly reduce the summation of the error (r).

At the time when the summation of the error (r) becomes within the predetermined acceptable range, the value of the variable $\phi$ (in claim 1, $\phi i+1$ of the expression (2)) becomes the solution to be sought.

Incidentally, the acceptable range can be arbitrarily defined according to the purpose, usage and the like of the simulation.

As described above, if we try to solve Poisson equation by the use of the implicit method, since the "k" is not a fixed value, it can not be solved by the cyclic reduction method as it is. However, in this invention, the concept of error is adopted, and in order to compute the error, the inverse matrix of the matrix of the uniform Cartesian grid model (k=constant) having the same boundary conditions as those of the nonuniform Cartesian grid model (k=not constant) is used, and thereby it makes it possible to apply the cyclic reduction method thereto. Further, the error is gradually decreased by correction. As a result, it makes it possible to compute the Poisson equation of which k is not constant by utilizing the cyclic reduction method. Accordingly, in comparison with the AMG method solver, the computational time and computational cost can be remarkably reduced with less memory usage.

In the above-mentioned example, the Cartesian grid is two-dimensional. However, it is of course possible that the Cartesian grid is three-dimensional. In such case, in the above-mentioned calculating process, the equation in the above-mentioned expression (1) is Fourier transformed beforehand. Thereby, the dimension of the matrix of the expression (1) is reduced to two-dimension. Thereafter, the computational procedure explained as above can be utilized as it is.

Concretely speaking, the above-mentioned expression (7) can be transformed into expression (8) in the form of a determinant.

$$\begin{bmatrix} T_1 & b_1 & 0 & 0 \\ a_2 & T_2 & b_2 & 0 \\ 0 & \ldots & \ldots & \ldots \\ 0 & 0 & a_n & T_n \end{bmatrix} \begin{bmatrix} \Phi_1 \\ \Phi_2 \\ \ldots \\ \Phi_n \end{bmatrix} = \begin{bmatrix} s_1 \\ s_2 \\ \ldots \\ s_n \end{bmatrix} \qquad \text{expression (8)}$$

Here, each element Ti of the expression (8) means the matrix A in FIG. 14.

The "$\phi i$" (i=1 to n) means a matrix as an aggregation of (I).
The "Si" (i=1 to n) means a source term corresponding to [ri/k_bar].

The 4-by-4 matrix shown in the expression (8) corresponds to the "Auni−1".

The matrix of the expression (8) can be transformed into the matrix of the expression (9) by Fourier transformation.

$$\begin{bmatrix} \tilde{T}_1 \tilde{\Phi}_1 = \tilde{s}_1 \\ \tilde{T}_2 \tilde{\Phi}_2 = \tilde{s}_2 \\ \ldots \\ \tilde{T}_n \tilde{\Phi}_n = \tilde{s}_n \end{bmatrix} \qquad \text{expression (9)}$$

Each matrix element of the expression (9) as shown as $$\tilde{T}_l \tilde{\Phi}_l = \tilde{s}_l \qquad \text{expression (10)}$$

(l:1 to n) can be calculated by utilizing the Block-cyclic Reduction Algorithm according to the above-explained computational procedure.

In the expressions (9) and (10), the addition of the tilde ~ means that the item goes to Fourier space.

[Comparison Test]

using the method according to the present invention and the above-mentioned AMG method, the same problem was solved, and the results were compared with each other.

The computer used was as follows.
- Hardware: HP xw9300 workstation
- CPU: AMD Dual-core opteron 275 (2.2 GHz)
- Memory: 32 GB
- OS: x86 64 redhat linux The software used was as follows.

AMG method: AMG method solver incorporated in Fluent ver.6.3.26 configuration: Additive corrective Multi-Grid, Coarsen by 2 cells, Pre-smoothing iteration=0, post smoothing iterations=2, smoother=Gauss-Seidel method, v-cycle Method according to the present invention: custom program written in C++ so as to use one of the dual cores <Problem Definition>

Figure 23:
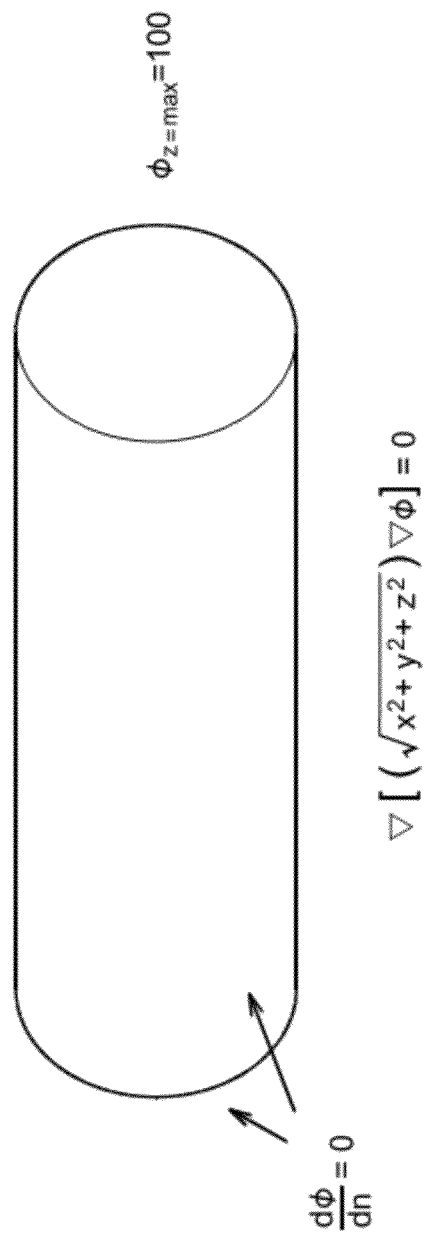
FIG. 23 is a perspective view of a three-dimensional space of which nonuniform Cartesian grid models (5, 10 and 15 million cell models) are defined and used in the comparative test.

As shown in FIG. 23, a model of a three-dimensional cylindrical space was defined as a nonuniform Cartesian grid. The constant k of Poisson equation was defined as $$k = \sqrt[l]{x^2 + y^2 + z^2}$$

namely, as a function of the coordinates of the grid. Therefore, the Poisson equation to be calculated is $$\nabla[(\sqrt[l]{x^2 + y^2 + z^2})\nabla\phi] = 0 \qquad \text{expression (11).}$$

As to the scale of the grid, three types of models (the number of the cells=5,000,000, 10,000,000 and 15,000,000) were prepared.

Using these models, the number of iterations and the computational time required to reduce the error down to 1/1000 of the value obtained by the first time computation were obtained.

<Test Results>

Figure 24:
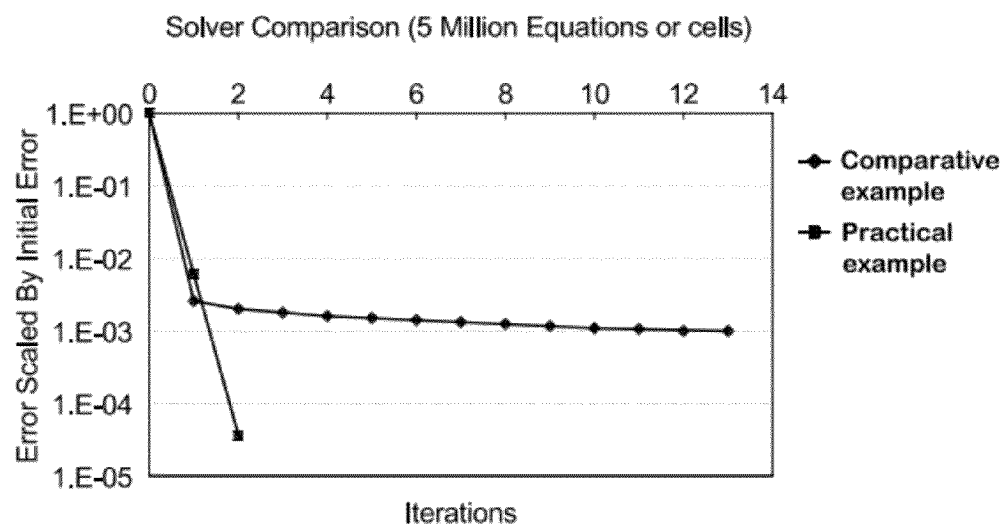
FIG. 24 is a graph showing the convergence test results on the 5 million cell model.
Figure 25:
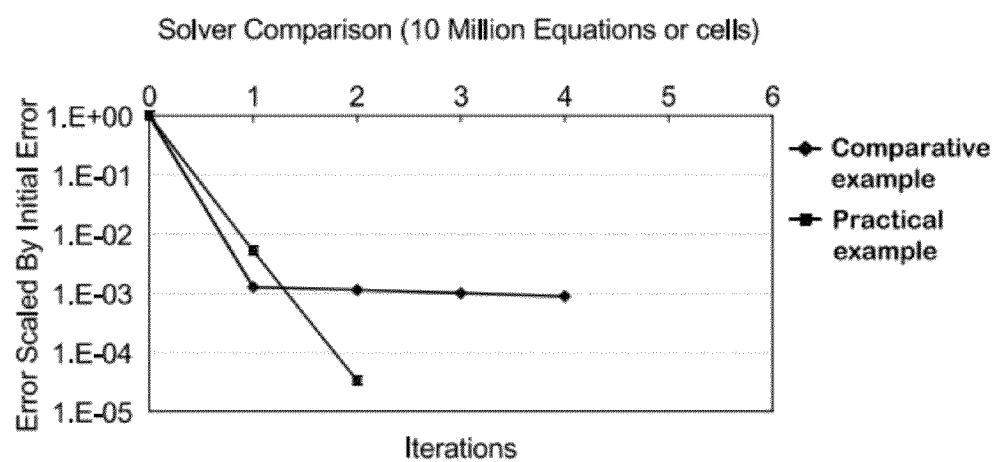
FIG. 25 is a graph showing the convergence test results on the 10 million cell model.
Figure 26:
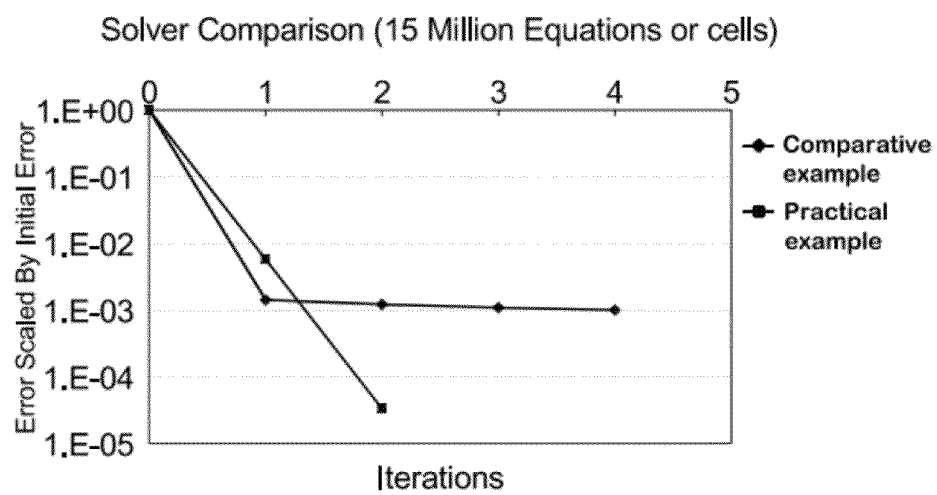
FIG. 26 is a graph showing the convergence test results on the 15 million cell model.

FIGS. 24, 25 and 26 show the convergence of the error (solution), wherein the date are normalized based on the value of the error at the first time computation being 1.

As explained above, the error of each cell is src−A·$\phi$. The summation of the error is $\Sigma|ri|$.

As shown in the test results, in the comparative example in which the Fluent's AMG method solver was used, at least four time iterative computation was needed in order to reduce the error down to 1/1000 (1.0E-3).

In contrast, in the practical example according to the invention, by making only three time iterative computation, the error became under 1/1000 in every model.

Figure 27:
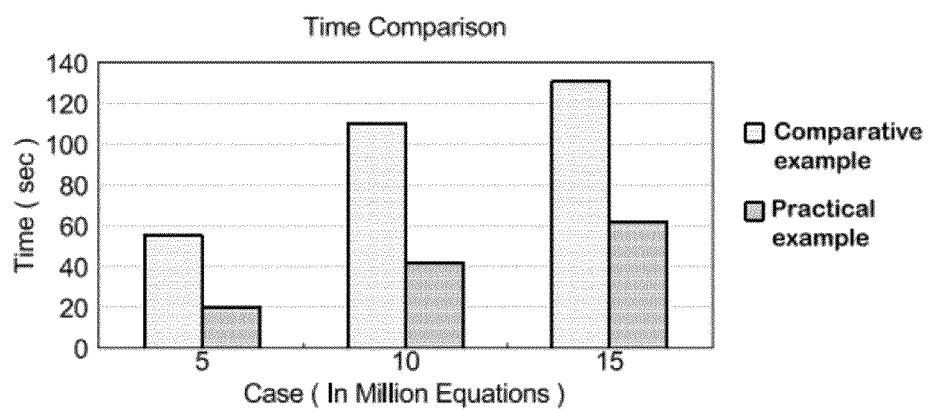
FIG. 27 is a graph showing the computational times.

FIG. 27 shows comparisons of the computational times. As shown, in the case of the practical example, the convergent solution could be obtained at short times less than one half of those in the comparative example.

Further, with respect to the 10 million cell model, it is observed how the values of the error are changed by increasing the number of iterations of the computation.

Figure 28:
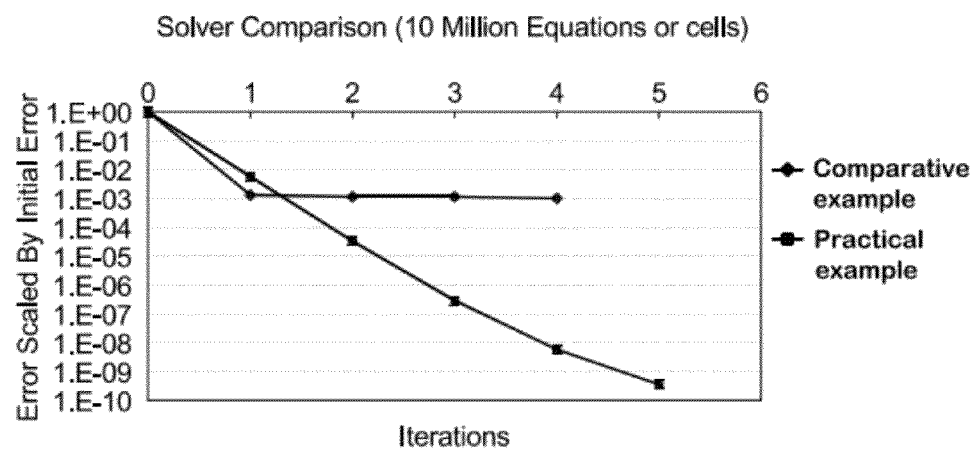
FIG. 28 is a graph showing the error on the 10 million cell model as a function of the number of iteration of computation.

FIG. 28 shown the results. As shown, in the case of the comparative example, the decreasing of the error soon reaches a limit, and even if the number of iterations is increased, the error can not be reduced more.

In the case of the practical example, however, the error decreases almost linearly. This is a merit of the present invention.

Figure 29:
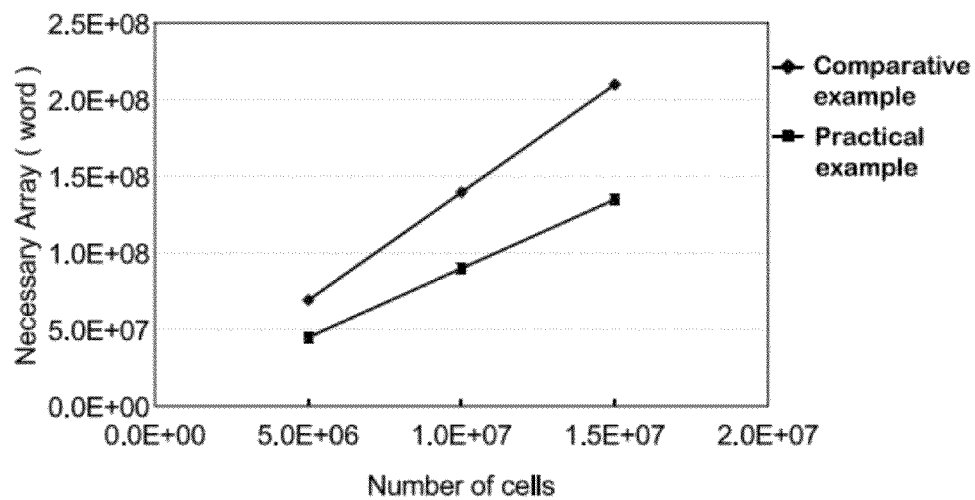
FIG. 29 is a graph showing the necessary memory as a function of the cell number.

FIG. 29 shows a comparison of the memory size necessary for solving the problem.

In the case of the comparative example, the necessary memory arrays are 7×N×2=14N, wherein N is the number of the cells. In the case of the practical example, the necessary memory arrays are 9×N. Accordingly, the memory usage in the practical example is about 65% of that in the comparative example.

Figure 30A:
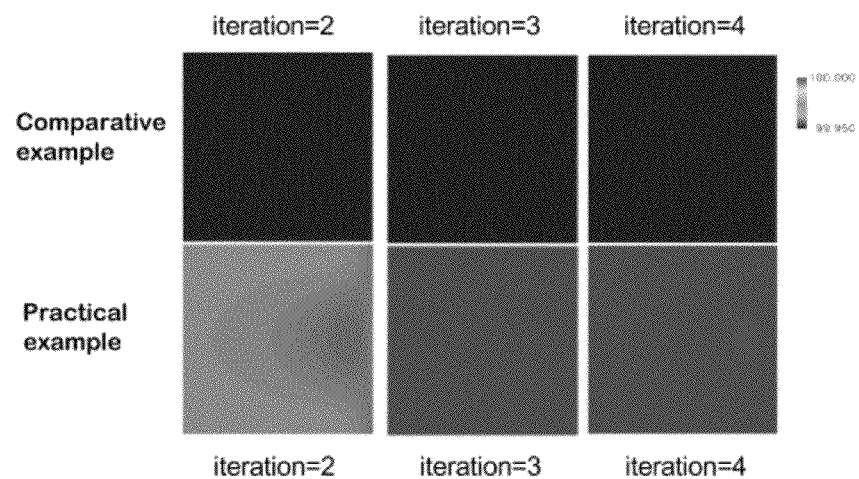
FIGS. 30(a) and 30(b) are maps of the solutions of Poisson equations at the 2nd, 3rd, 4th 100th, 800th and 2000th iterative computation.
Figure 30B:
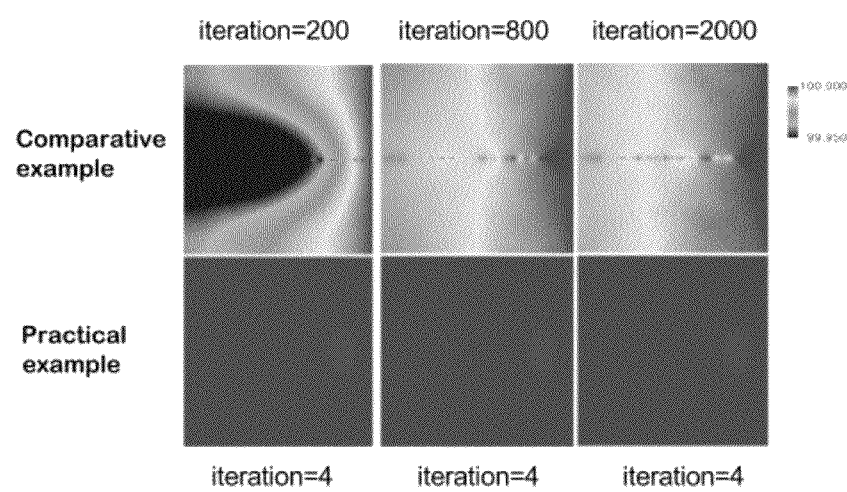

FIGS. 30(a) and 30(b) show maps of the solutions of the Poisson equations of the respective cells.

In theory, the correct solution is such that the values at all area (cells) are 100.

In the case of the practical example, by making only three time iterative computation, "100" as the convergent solution could be obtained.

In the case of the comparative example, however, even after 2,000 time iterative computation, the values at almost all area were under 100. Namely, the error could not be reduced.

Although the maps in the attached drawings are monochrome, in the original maps, different values are indicated in different colors.

Figure 31:
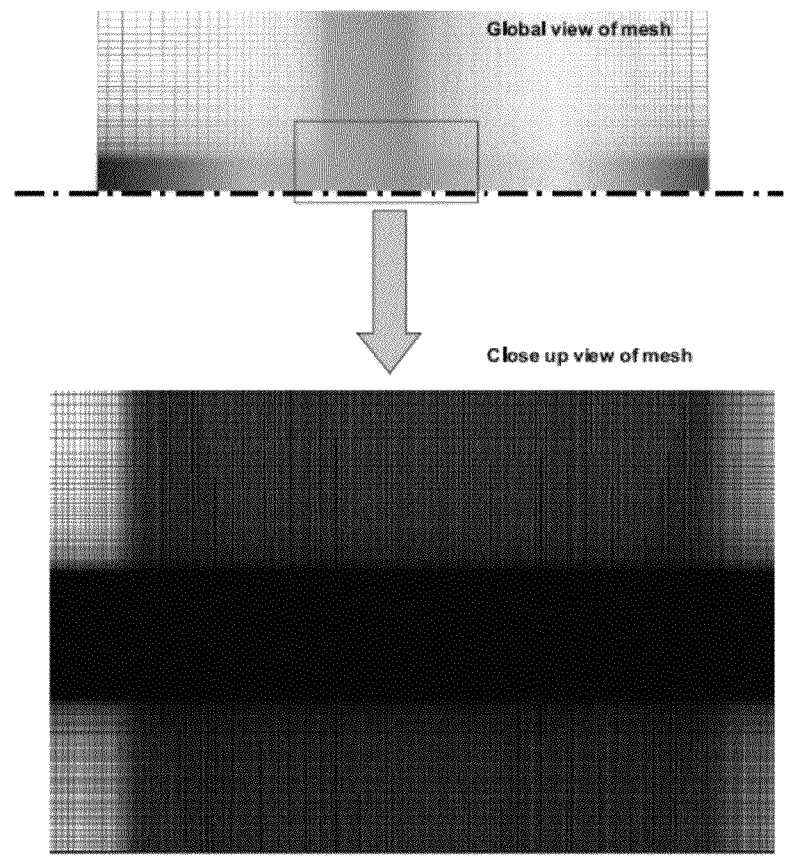
FIG. 31 is a large-scale 3-D model of an nonuniform Cartesian grid composed of 100 million cells.

In order to show the superiority of the method according to the present invention, with respect to a large-scale nonuniform Cartesian grid model shown in FIG. 31 (the number of the cells was 100 million, and the degree of the nonuniformity is high), the convergence was tested. The Poisson equation had the same form as the above example.

Figure 32:
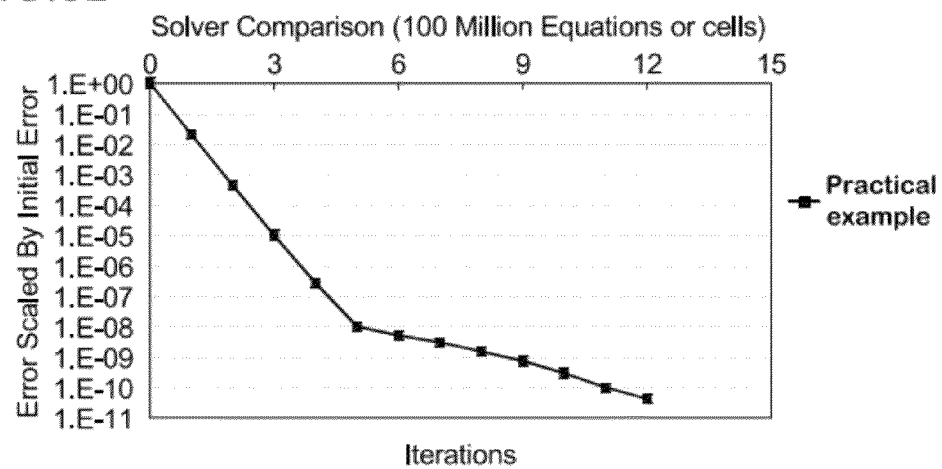
FIG. 32 is a graph showing the convergence test results on the 100 million cell model shown in FIG. 31.

FIG. 32 shows the convergence of the error, wherein the date are normalized based on the respective values of the error at the first time computation being 1.

As shown, in the practical example according to the invention, regardless of whether the matrix is very large scale, by making only five time iterative computation, the error could be reduced down to $1/100{,}000{,}000$ (1.0E-8).

In such a large-scale model problem, to obtain the convergent solution at high speed like this will be impossible unless the method of the present invention is employed.

Further, in the method of the present invention, the error can be reduced down to under 1.0E-10 by making only 12 time iterative computation. In a large-scale model problem, a computational procedure for Poisson equation which can reduce the error down to such very small values maybe do not exist other than the method of the present invention.

The invention claimed is:

1. A simulation method utilizing a Cartesian grid comprising:
   a grid defining process in which a model of a two-dimensional or three-dimensional space is defined as a Cartesian grid composed of cells, the Cartesian grid being non-uniform;
   the Poisson equation defining process in which, based on a physical value and condition associated with the Cartesian grid, the Poisson equation $$\nabla[k\nabla\phi]=\text{src} \qquad \text{expression (1)}$$

k: a constant defined for each cell individually,
   φ: a variable to be calculated and src: a source term
   is defined, and the Poisson equation being non-uniform such that the constants k defined for the cells of the Cartesian grid are not a fixed value;
   a calculating process performed by a computer in which, said physical value is calculated by approximately solving the Poisson equation,
   wherein the calculating process comprises:
   an error calculating step of calculating an error by using a Block-Cyclic Reduction Algorithm,
   a testing step of checking whether the calculated error is within a predetermined acceptable range or not, and
   an error correcting step of correcting the variable φ by the use of a correction parameter if the calculated error is outside the predetermined acceptable range, and
   said calculating process repeats said error calculating step, testing step and error correcting step until the error becomes within the predetermined acceptable range, whereby the Poisson equation is solved approximately,
   wherein in the error calculating step, an error (r) is defined as $$\text{error}(r) = \text{src} - A \cdot \phi$$

src is the above-mentioned source term, φ is the above-mentioned variable,
   A is the matrix of the Poisson equation is calculated, and
   wherein zero is given to the φ in the first time computation of the error(r), and in the second time computation and the rest, the φ is given by $$\phi = \phi\text{old} + \phi'\text{corr}$$

φold is the previous calculated value of the φ, φ'corr is the above-mentioned correction parameter indicating a correcting quantity to reduce the above-mentioned error and defined as $$\phi'\text{corr} = A\text{uni}-1 \cdot [r/k\_\text{bar}]$$

k_bar is the average value of the values of k across all of the cells, and
   Auni−1 is the inverse matrix of a matrix of a uniform Cartesian grid having the same boundary conditions as those of said non-uniform Cartesian grid.

2. The simulation method according to claim 1, wherein the Cartesian grid is of the two-dimensional space.

3. The simulation method according to claim 1, wherein the Cartesian grid is of the three-dimensional space.

4. The simulation method according to claim 3, wherein the Cartesian grid is of the three-dimensional space, and in said calculating process, prior to the calculation of the φ'corr by the use of the Block-Cyclic Reduction Algorithm, φ'corr is decreased in the dimension number down to two by Fourier transform.

* * * * *